(12) United States Patent
Mokhlesi

(10) Patent No.: US 7,696,035 B2
(45) Date of Patent: Apr. 13, 2010

(54) METHOD FOR FABRICATING NON-VOLATILE MEMORY WITH BOOST STRUCTURES

(75) Inventor: Nima Mokhlesi, Los Gatos, CA (US)

(73) Assignee: Sandisk Corporation, Milpitas, CA (US)

( * ) Notice: Subject to any disclaimer, the term of this patent is extended or adjusted under 35 U.S.C. 154(b) by 536 days.

(21) Appl. No.: 11/558,986

(22) Filed: Nov. 13, 2006

(65) Prior Publication Data

US 2008/0113479 A1    May 15, 2008

(51) Int. Cl.
*H01L 21/8238* (2006.01)

(52) U.S. Cl. ............... 438/211; 438/257; 257/E21.681; 365/185.17

(58) Field of Classification Search ......... 438/257–266, 438/201, 211, 593; 257/314, 315, E29.129, 257/E29.3, E21.179, E21.422, E21.68, E21.687, 257/E21.688, E21.681, E21.662; 365/185.17
See application file for complete search history.

(56) References Cited

U.S. PATENT DOCUMENTS

| | | | |
|---|---|---|---|
| 5,386,422 A | | 1/1995 | Endoh |
| 5,522,580 A | | 6/1996 | Varner, Jr. |
| 5,570,315 A | | 10/1996 | Tanaka |
| 5,774,397 A | | 6/1998 | Endoh |
| 5,877,980 A | | 3/1999 | Mang |
| 5,936,887 A | | 8/1999 | Choi |
| 5,990,514 A | * | 11/1999 | Choi et al. .................. 257/315 |
| 6,044,017 A | | 3/2000 | Lee |
| 6,046,935 A | | 4/2000 | Takeuchi |
| 6,093,605 A | | 7/2000 | Mang |
| 6,222,762 B1 | | 4/2001 | Guterman |
| 6,246,607 B1 | | 6/2001 | Mang |
| 6,266,275 B1 | | 7/2001 | Chen et al. |
| 6,310,374 B1 | | 10/2001 | Satoh et al. |
| 6,456,528 B1 | | 9/2002 | Chen |
| 6,522,580 B2 | | 2/2003 | Chen |
| 6,667,211 B2 | | 12/2003 | Watanabe |
| 6,677,199 B1 | | 1/2004 | Chang |
| 6,760,253 B2 | | 7/2004 | Kamei |

(Continued)

OTHER PUBLICATIONS

Choi, "A triple polysilicon stacked flash memory cell with wordline self-boosting programming," 1997 IEEE, pp. 283-286.

(Continued)

*Primary Examiner*—Khiem D Nguyen
(74) *Attorney, Agent, or Firm*—Vierra Magen Marcus & DeNiro LLP

(57) ABSTRACT

A method for fabricating a non-volatile memory having boost structures. Boost structures are provided for individual NAND strings and can be individually controlled to assist in programming, verifying and reading processes. The boost structures can be commonly boosted and individually discharged, in part, based on a target programming state or verify level. The boost structures assists in programming so that the programming and pass voltage on a word line can be reduced, thereby reducing side effects such as program disturb. During verifying, all storage elements on a word line can be verified concurrently. The boost structure can also assist during reading. In one approach, the NAND string has dual source-side select gates between which the boost structure contacts the substrate at a source/drain region, and a boost voltage is provided to the boost structure via a source-side of the NAND string.

11 Claims, 22 Drawing Sheets

U.S. PATENT DOCUMENTS

| | | | |
|---|---|---|---|
| 6,845,042 | B2 | 1/2005 | Ichige |
| 6,859,397 | B2 | 2/2005 | Lutze |
| 7,046,568 | B2 | 5/2006 | Cernea |
| 7,061,040 | B2 | 6/2006 | Shih |
| 7,196,928 | B2 | 3/2007 | Chen |
| 7,327,606 | B2 | 2/2008 | Lee |
| 7,362,615 | B2 | 4/2008 | Pham et al. |
| 7,429,765 | B2 * | 9/2008 | Goda et al. ............ 257/314 |
| 2001/0045585 | A1 | 11/2001 | Watanabe |
| 2003/0094635 | A1 | 5/2003 | Yaegashi |
| 2004/0057287 | A1 | 3/2004 | Cernea |
| 2004/0109357 | A1 | 6/2004 | Cernea |
| 2004/0255090 | A1 | 12/2004 | Guterman |
| 2005/0024939 | A1 | 2/2005 | Chen |
| 2005/0180186 | A1 | 8/2005 | Lutze |
| 2005/0199939 | A1 | 9/2005 | Lutze |
| 2006/0039230 | A1 | 2/2006 | Kurata |
| 2006/0108628 | A1 | 5/2006 | Hung |
| 2006/0126390 | A1 | 6/2006 | Gorobets |
| 2006/0140007 | A1 | 6/2006 | Cernea |
| 2006/0145241 | A1 | 7/2006 | Forbes |
| 2006/0158947 | A1 | 7/2006 | Chan |
| 2007/0147119 | A1 * | 6/2007 | Pham et al. ............ 365/185.17 |

OTHER PUBLICATIONS

Choi, "A novel booster plate technology in high density NAND flash memories for voltage scaling-down and zero program disturbance," 1996 Symposium on VLSI Technology Digest of Technical Papers, pp. 238-239.

Kim, "Fast parallel programming of multi-level NAND flash memory cells using the booster-line technology," 1997 Symposium on VLSI Technology Digest of Technical Papers, pp. 65-66.

Satoh, "A novel channel boost capacitance (CBC) cell technology with low program disturbance suitable for fast programming 4Gbit NAD Flash memories," 1998 Symposium on VLSI Technology Digest of Technical Papers, pp. 108-109.

Notice of Allowance, dated Oct. 22, 2008, U.S. Appl. No. 11/558,980, filed Nov. 13, 2006.

Notice of Allowance, dated Nov. 18, 2008, U.S. Appl. No. 11/558,984, filed Nov. 13, 2006.

Office Action dated Jun. 23, 2008, U.S. Appl. No. 11/558,980, filed Nov. 13, 2006.

Office Action dated Jun. 25, 2008, U.S. Appl. No. 11/558,984, filed Nov. 13, 2006.

International Search Report dated Jun. 4, 2008 in PCT Application No. PCT/US2007/084461.

Written Opinion of the International Searching Authority dated Jun. 4, 2008 in PCT Application No. PCT/US2007/084461.

* cited by examiner

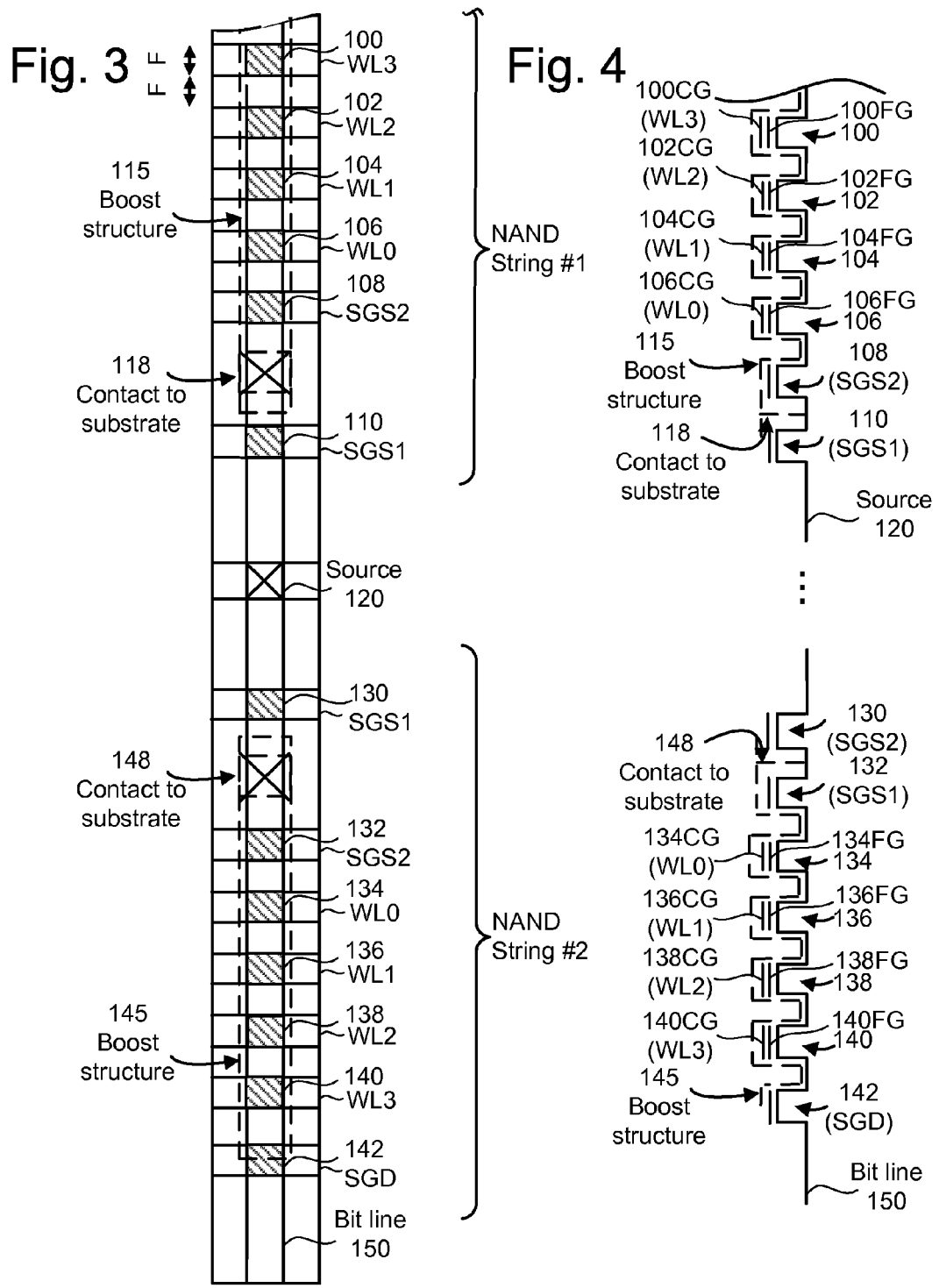

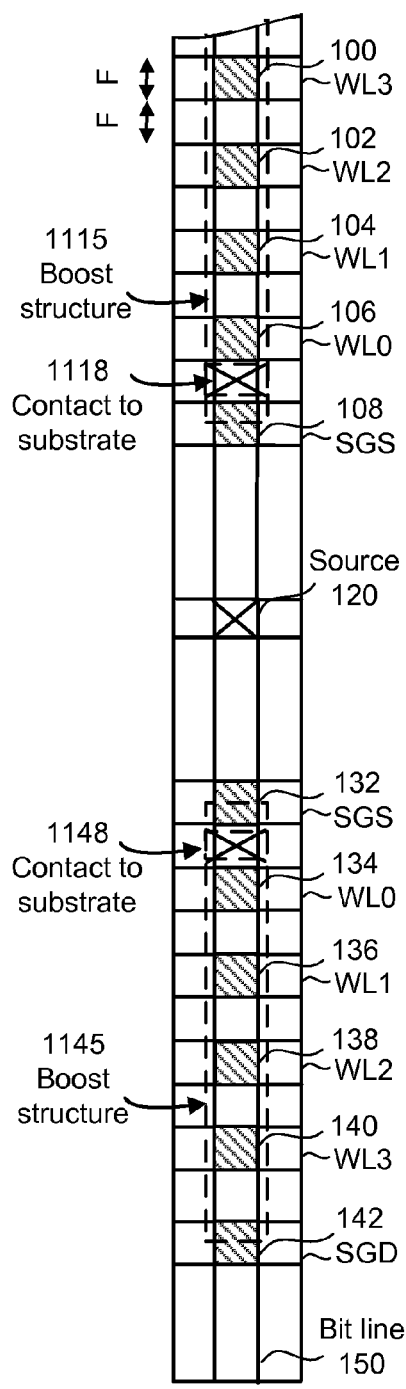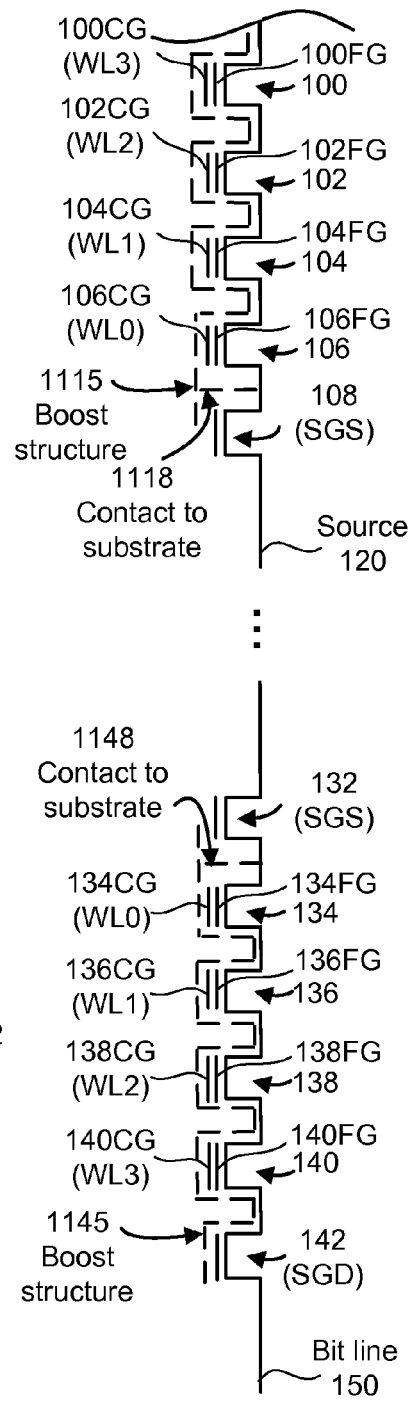

METHOD FOR FABRICATING NON-VOLATILE MEMORY WITH BOOST STRUCTURES

CROSS-REFERENCE TO RELATED APPLICATIONS

This application is related to co-pending, commonly assigned U.S. patent application Ser. No. 11/558,980, filed Nov. 13, 2006, published as US20080112230, titled "Operating Non-Volatile Memory With Boost Structures", and co-pending, commonly assigned U.S. patent application Ser. No. 11/558,984, filed Nov. 13, 2006, published as US20080112226, titled "Non-Volatile Memory With Boost Structures", each of which is incorporated herein by reference.

BACKGROUND OF THE INVENTION

1. Field of the Invention

The present invention relates to non-volatile memory.

2. Description of the Related Art

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both the traditional EEPROM and the flash memory utilize a floating gate that is positioned above and insulated from a channel region in a semiconductor substrate. The floating gate is positioned between the source and drain regions. A control gate is provided over and insulated from the floating gate. The threshold voltage of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

Some EEPROM and flash memory devices have a floating gate that is used to store two ranges of charges and, therefore, the memory element can be programmed/erased between two states, e.g., an erased state and a programmed state. Such a flash memory device is sometimes referred to as a binary flash memory device because each memory element can store one bit of data.

A multi-state (also called multi-level) flash memory device is implemented by identifying multiple distinct allowed/valid programmed threshold voltage ranges. Each distinct threshold voltage range corresponds to a predetermined value for the set of data bits encoded in the memory device. For example, each memory element can store two bits of data when the element can be placed in one of four discrete charge bands corresponding to four distinct threshold voltage ranges.

Typically, a program voltage $V_{PGM}$ applied to the control gate during a program operation is applied as a series of pulses that increase in magnitude over time. In one possible approach, the magnitude of the pulses is increased with each successive pulse by a predetermined step size, e.g., 0.2-0.4 V. $V_{PGM}$ can be applied to the control gates of flash memory elements. In the periods between the program pulses, verify operations are carried out. That is, the programming level of each element of a group of elements being programmed in parallel is read between successive programming pulses to determine whether it is equal to or greater than a verify level to which the element is being programmed. For arrays of multi-state flash memory elements, a verification step may be performed for each state of an element to determine whether the element has reached its data-associated verify level. For example, a multi-state memory element capable of storing data in four states may need to perform verify operations for three compare points.

Moreover, when programming an EEPROM or flash memory device, such as a NAND flash memory device in a NAND string, typically $V_{PGM}$ is applied to the control gate and the bit line is grounded, causing electrons from the channel of a cell or memory element, e.g., storage element, to be injected into the floating gate. When electrons accumulate in the floating gate, the floating gate becomes negatively charged and the threshold voltage of the memory element is raised so that the memory element is considered to be in a programmed state. More information about such programming can be found in U.S. Pat. No. 6,859,397, titled "Source Side Self Boosting Technique For Non-Volatile Memory," and in U.S. Patent Application Pub. 2005/0024939, titled "Detecting Over Programmed Memory," published Feb. 3, 2005; both of which are incorporated herein by reference in their entirety.

However, during programming, various problems such as program disturb can occur due to the need to apply relatively high voltages to the word lines. Accordingly, there is a continuing need to further optimize programming operations as well as verify and read operations.

SUMMARY OF THE INVENTION

The present invention addresses the above and other issues by providing a method for fabricating non-volatile memory with boost structures.

In one embodiment, a method for fabricating non-volatile storage includes forming a set of storage elements, at least in part, on a substrate, forming inner and outer select gates at a first end of the set of storage elements and forming a boost structure extending along the set of storage elements and in communication with the substrate at a location between the inner and outer select gates.

When operating the non-volatile storage, after a boost voltage is applied to the boost structure, the boost structure can be further boosted by applying an elevated voltage to word lines associated with the NAND string. Subsequently, the boost structure can be discharged, at least in part, to a level which is based on a programming state to which a storage element is to be programmed. The level to which the boost structure is discharged can be controlled by controlling a voltage applied to a drain side of the NAND string, e.g., via a bit line. After the discharging, programming can occur by applying a programming voltage to a storage element in the NAND string, e.g., via a selected word line. Advantageously, the boost structure assists in the programming process so that a lower programming voltage can be applied on the selected word line.

In a verify process, which can occur between programming pulses, the boost structure can be boosted again and discharged independently for each NAND string to a level which is based on a verify level. A voltage is then applied to a storage element in each NAND string to characterize a programming state of the storage element. With this approach, multiple storage elements along a word line in different NAND strings can be concurrently characterized based on different verify levels while a common word line voltage is used.

A read process can involve a number of read cycles, one for each read level. In each read cycle, the boost structures are commonly boosted and discharged to a common level which is based on a read level which differs in each read cycle.

In another embodiment, a method for fabricating non-volatile storage includes forming a number of NAND strings on a substrate, forming inner and outer select gates at a first end of each NAND string and forming a number of boost structures. Each boost structure extends along a respective NAND string and communicates with the substrate at a respective location between the first and second select gates of the respective NAND string.

In another embodiment, a method for fabricating non-volatile storage includes forming a number of NAND strings on a substrate, forming a number of boost structures, each boost structure extending along a respective NAND string and forming control lines for concurrently applying a common boost voltage to each boost structure, and for independently discharging each boost structure, at least in part.

BRIEF DESCRIPTION OF THE DRAWINGS

FIG. 3 is a top view of an alternative embodiment of two adjacent NAND strings with boost structures.

FIG. 4 is an equivalent circuit diagram of the NAND strings of FIG. 3.

FIGS. 6-10 depict fabrication of non-volatile storage with boost structures.

FIG. 6 depicts non-volatile storage.

FIG. 7 depicts details of a portion of FIG. 6.

FIG. 8 depicts the non-volatile storage of FIG. 6 after depositing an insulating layer.

FIG. 10 depicts the non-volatile storage of FIG. 9b after depositing a conductive layer which provides a boost structure.

FIG. 11 is a top view of another embodiment of two adjacent NAND strings with boost structures.

FIG. 12 is an equivalent circuit diagram of the NAND strings of FIG. 11.

DETAILED DESCRIPTION

Figure 1:
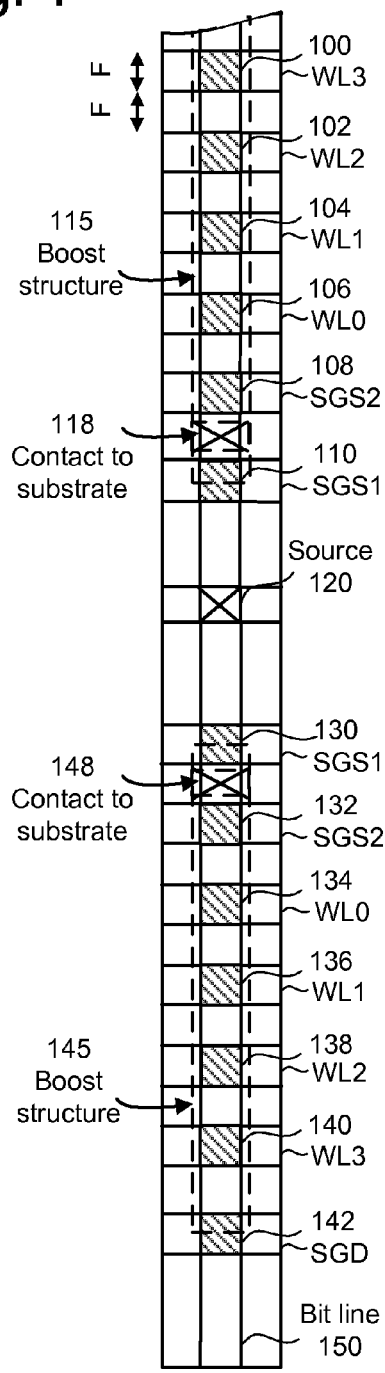
FIG. 1 is a top view of two adjacent NAND strings with boost structures.

One example of a non-volatile memory system suitable for use with the present invention uses a NAND flash memory structure, in which multiple transistors are arranged in series between select gates in a NAND string. FIG. 1 is a top view showing two NAND strings arranged one after another. In practice, a number of such NAND strings can be arranged one after another in a two-dimensional array across a semiconductor device and, optionally, in three dimensions. The NAND strings depicted in FIGS. 1 and 2 each include four transistors in series and sandwiched between select gates. In one embodiment, each NAND string includes two source-side select gates and one drain-side select gate. For example NAND string #1 includes transistors 100, 102, 104 and 106 sandwiched between a drain-side select gate (not shown) and source-side select gates 108 and 110. Select gates 108 and 110 can be connected to, or provided as part of, control lines SGS2 and SGS1, respectively, of the associated NAND string. NAND string #2 includes transistors 134, 136, 138 and 140 sandwiched between source-side select gates 130 and 132 and a drain-side select gate 142. Select gates 130 and 132 can be connected to, or provided as part of, control lines SGS1 and SGS2, respectively, of the associated NAND string. Note that the depiction of one end region of NAND string #1 has been cut off on the drain side. Select gates 108 and 132 may be considered to be inner select gates and select gates 110 and 130 may be considered to be outer select gates based on their position relative to the respective NAND string.

In NAND string #1, for instance, a drain-side select gate (not shown) connects the NAND string to a bit line contact (not shown) on one end and the select gate 110 connects the NAND string to a source line contact 120 on the other end. Similarly, in NAND string #2, select gate 142 connects the NAND string to a bit line contact 150 on one end and the select gate 130 connects the NAND string to the source line contact 120 on the other end. The select gates are controlled by applying appropriate voltages via their control lines. In this approach, the NAND strings are arranged alternately source-side to source-side and drain-side to drain-side in a bit line direction. However, other approaches can also be used.

Further, in NAND string #1, each of the transistors 100, 102, 104 and 106 has a control gate and a floating gate. Specifically, referring to FIG. 2, transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gates 100CG, 102CG, 104CG and 106CG can be provided as portions of word lines WL3, WL2, WL1 and WL0, respectively. In one possible design, transistors 100, 102, 104 and 106 are each memory cells or non-volatile storage elements. In other designs, the memory elements may include multiple transistors or may be different than those depicted in FIGS. 1 and 2. Similarly, in NAND String #2, each of the transistors 134, 136, 138 and 140 has a control gate and a floating gate. Transistor 134 has control gate 134CG and floating gate 134FG. Transistor 136 includes control gate 136CG and floating gate 136FG. Transistor 138 includes control gate 138CG and floating gate 138FG. Transistor 140 includes a control gate 140CG and floating gate 140FG. Control gates 134CG, 136CG, 138CG and 140CG can be provided as portions of associated word lines WL0, WL1, WL2 and WL3, respectively. These are different word lines than those associated with NAND string #1.

In one possible implementation, F denotes the width of the word line, control gate and the floating gate of each memory element, as well as the spacing between memory elements. The source and drain select gates may also have a width of F. The spacing between the source-side select gates can be F or multiples of F, for instance. The use of dual source-side select gates is useful in preventing current leakage at the source side of the NAND through the select gates as well as in controlling a boost structure.

In particular, a boost structure such as a conductive plate or line can be provided for each NAND string, in one approach. NAND string #1 includes a boost structure 115 which extends along the NAND string and its storage elements and contacts the NAND string at a source/drain region between the source-side select gates 108 and 110 via a contact to substrate 118, in one approach. The boost structure 115 is thus in communication with the substrate. As described further below in detail, the boost structure can assist in programming, verify and/or read operations to optimize these processes for individual NAND strings. Similarly, NAND string #2 includes a boost structure 145 which extends along the NAND string and its storage elements and contacts the NAND string at a source/drain region between the source-side select gates 130 and 132 via a contact to substrate 148, in one approach. Other boost structure configurations can also be provided, such as a boost structure which is shared by one or more adjacent NAND strings in a word line direction and/or bit line direction. For example, the boost structure may extend over adjacent NAND strings which are programmed at different times using odd-even programming. Such a boost structure may contact source/drain regions in the adjacent NAND strings. In another approach, multiple boost structures are associated with one NAND string. Further, other boost structures need not contact a source/drain region of the substrate but can be controlled via other means. Also, other boost structures can contact the substrate at locations other than between two or more source-side select gates. A boost structure can similarly be used with a NAND string having a single source-side or drain-side select gate.

Figure 2:
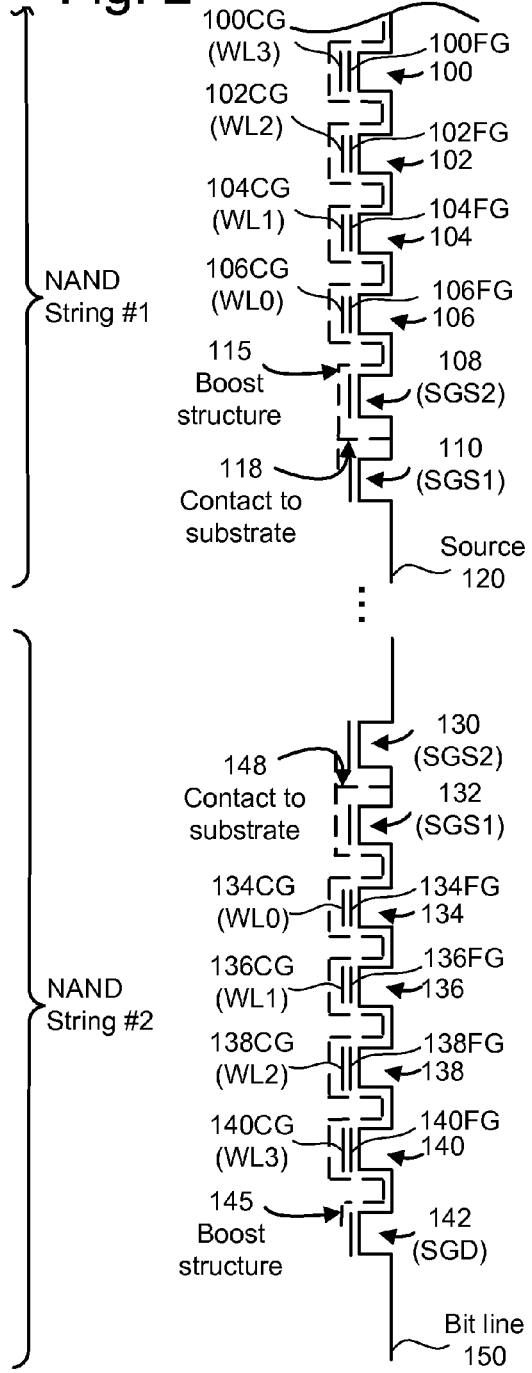
FIG. 2 is an equivalent circuit diagram of the NAND strings of FIG. 1.

In another variation, a boost structure can contact a NAND string on a drain side, e.g., near or adjacent to the drain-side select gate or between two or more drain-side select gates which are provided by analogy to the two source-side select gates of FIGS. 1 and 2. The boost structure can have various cross-sectional shapes. The boost structure can conform to the shape of the NAND string or can extend in a straight line. The boost structure can have various cross sectional shapes along its length, including rectangular like a thin strip, circular like a wire, and so forth. Further, the cross section can very along the length. For example, the cross section can be thicker in some locations than others. Also, the boost structure can extend along a portion of a NAND string, e.g., along only a portion of the storage elements, or along all of the storage elements of a NAND string. Other variations are also possible.

FIG. 3 is a top view of an alternative embodiment of two adjacent NAND strings. FIG. 4 is an equivalent circuit diagram of the NAND strings of FIG. 3. As mentioned, the spacing between the source-side select gates can be F or integer multiples of F, in one approach. In the present example, the spacing is 3F between the source-side select gates 108 and 110 in NAND string #1, and between source-side select gates 130 and 132 in NAND string #2. This approach can ease tolerances for locating the boost structures' contacts to the substrate 118 or 148, relative to the embodiment of FIGS. 1 and 2 which employs a spacing of F. In particular, larger, non-self-aligned contacts can be used for coupling the boost structure to the active area of the substrate, e.g., the source/drain regions.

Figure 5:
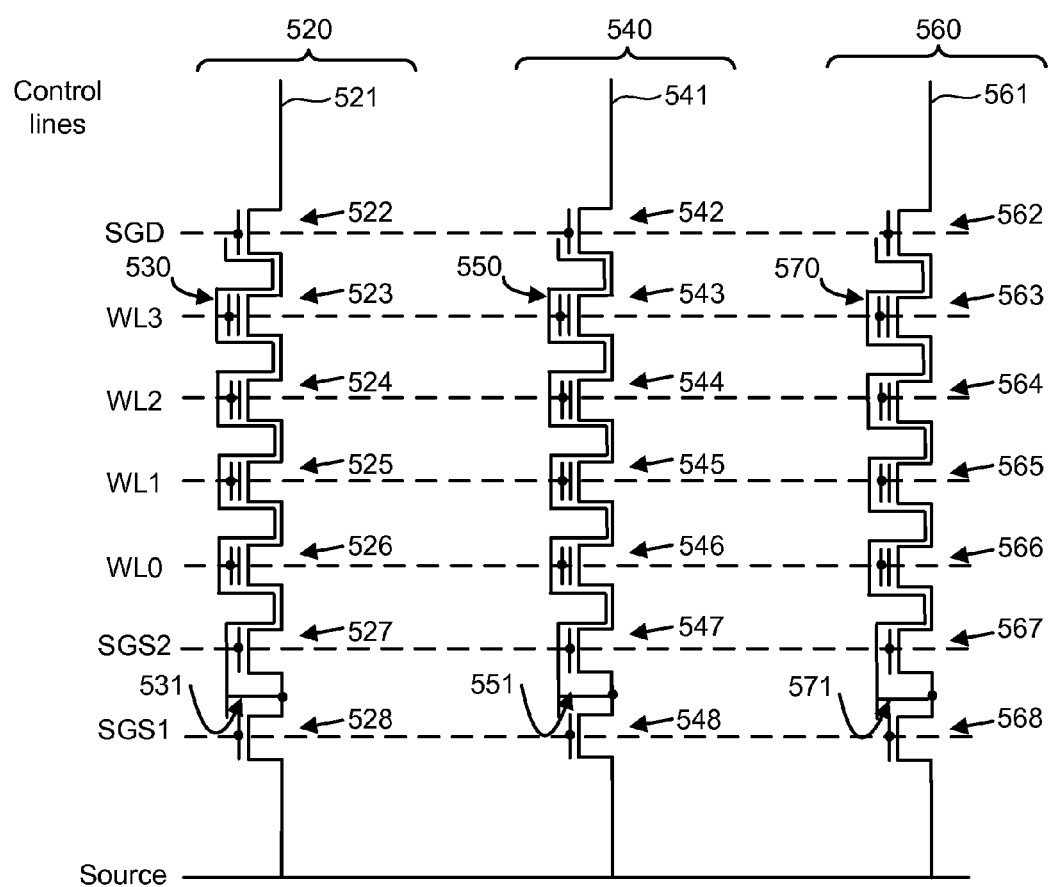
FIG. 5 is a circuit diagram depicting three NAND strings with dual source-side select gates and boost structures.

FIG. 5 is a circuit diagram depicting three NAND strings. The circuit diagram corresponds to the embodiment of FIGS. 1-4. A typical architecture for a flash memory system using a NAND structure will include several NAND strings. For example, three NAND strings 520, 540 and 560 are shown in a memory array having many more NAND strings. In this example, each of the NAND strings includes two source-side select gates, four storage elements and one drain-side select gate. While four storage elements are illustrated for simplicity, modern NAND strings can have up to thirty-two or sixty-four storage elements, for instance.

For example, NAND string 520 includes drain-side select gate 522, storage elements 523-526, source-side select gates 527 and 528, and boost structure 530 with a contact to substrate 531. NAND string 540 includes drain-side select gate 542, storage elements 543-546, source-side select gates 547 and 548, and boost structure 550 with a contact to substrate 551. NAND string 560 includes drain-side select gate 562, storage elements 563-566, source-side select gates 567 and 568, and boost structure 570 with a contact to substrate 571. Each NAND string is connected to the source line by a select gate. Selection lines or control lines SGS1 and SGS2 are used to control the source-side select gates. The various NAND strings 520, 540 and 560 are connected to respective bit lines 521, 541 and 561 by select transistors in the select gates 522, 542, 562, etc. These select transistors are controlled by a drain select line or control line SGD. In other embodiments, the select lines do not necessarily need to be in common among the NAND strings; that is, different select lines can be provided for different NAND strings. Word line WL3 is connected to the control gates for storage elements 523, 543 and 563. Word line WL2 is connected to the control gates for storage elements 524, 544 and 564. Word line WL1 is connected to the control gates for storage elements 525, 545 and 565. Word line WL0 is connected to the control gates for storage elements 526, 546 and 566. As can be seen, each bit line and the respective NAND string comprise the columns of the array or set of storage elements. The word lines (WL3, WL2, WL1 and WL0) comprise the rows of the array or set. Each word line connects the control gates of each storage element in the row. Or, the control gates may be provided by the word lines themselves. For example, word line WL2 provides the control gates for storage elements 524, 544 and 564. In practice, there can be thousands of storage elements on a word line.

In one embodiment, data is programmed to storage elements along a common word line. Thus, prior to applying the program pulses, one of the word lines is selected for programming. This word line is referred to as the selected word line. The remaining word lines of a block are referred to as the unselected word lines. The selected word line may have one or two neighboring word lines. If the selected word line has two neighboring word lines, then the neighboring word line on the drain side is referred to as the drain-side neighboring word line and the neighboring word line on the source side is referred to as the source-side neighboring word line. For example, if WL2 is the selected word line, then WL1 is the source-side neighboring word line and WL3 is the drain-side neighboring word line.

Each block of storage elements includes a set of bit lines forming columns and a set of word lines forming rows. In one embodiment, the bit lines are divided into odd bit lines and even bit lines. As discussed also in connection with FIG. 19, storage elements along a common word line and connected to the odd bit lines are programmed at one time, while storage elements along a common word line and connected to even bit lines are programmed at another time ("odd/even programming"). In another embodiment, storage elements are programmed along a word line for all bit lines in the block ("all bit line programming"). In other embodiments, the bit lines or block can be broken up into other groupings (e.g., left and right, more than two groupings, etc.)

Further, each storage element can store data. For example, when storing one bit of digital data, the range of possible threshold voltages ($V_{TH}$) of the storage element is divided into two ranges which are assigned logical data "1" and "0." In one example of a NAND type flash memory, the $V_{TH}$ is negative after the storage element is erased, and defined as logic "1." The $V_{TH}$ after a program operation is positive and defined as logic "0." When the $V_{TH}$ is negative and a read is attempted, the storage element will turn on to indicate logic "1" is being stored. When the $V_{TH}$ is positive and a read operation is attempted, the storage element will not turn on, which indicates that logic "0" is stored. A storage element can also store multiple levels of information, for example, multiple bits of digital data. In this case, the range of $V_{TH}$ value is divided into the number of levels of data. For example, if four levels of information are stored, there will be four $V_{TH}$ ranges assigned to the data values "11", "10", "01", and "00." In one example of a NAND type memory, the $V_{TH}$ after an erase operation is negative and defined as "11". Positive $V_{TH}$ values are used for the states of "10", "01", and "00." The specific relationship between the data programmed into the storage element and the threshold voltage ranges of the element depends upon the data encoding scheme adopted for the storage elements. For example, U.S. Pat. No. 6,222,762 and U.S. Patent Application Pub. 2004/0255090, both of which are incorporated herein by reference in their entirety, describe various data encoding schemes for multi-state flash storage elements.

Relevant examples of NAND type flash memories and their operation are provided in U.S. Pat. Nos. 5,386,422, 5,522, 580, 5,570,315, 5,774,397, 6,046,935, 6,456,528 and 6,522, 580, each of which is incorporated herein by reference.

When programming a flash storage element, a program voltage is applied to the control gate of the storage element and the bit line associated with the storage element is grounded. Electrons from the channel are injected into the floating gate. When electrons accumulate in the floating gate, the floating gate becomes negatively charged and the $V_{TH}$ of the storage element is raised. To apply the program voltage to the control gate of the storage element being programmed, that program voltage is applied on the appropriate word line. As discussed above, one storage element in each of the NAND strings share the same word line. For example, when programming storage element 524 of FIG. 5, the program voltage will also be applied to the control gates of storage elements 544 and 564.

However, shifts in the charged stored in a storage element can occur when programming and reading a given storage element and other storage elements which have some degree of coupling with the given storage element, such as those sharing the same word line or bit line. Specifically, shifts in the stored charge levels occur because of field coupling between storage elements. The problem is exacerbated as the spaces between storage elements are being decreased due to improvements in integrated circuit manufacturing techniques. The problem occurs most markedly between two groups of adjacent storage elements that have been programmed at different times. One group of storage elements is programmed to add a level of charge that corresponds to one set of data. After a second group of storage elements is programmed with a second set of data, the charge levels read from the first group of storage elements often appear to be different than what was programmed due to capacitive coupling of the charges of the second group of storage elements to the first group of storage elements. Thus, the effects of coupling depend on the order in which the storage elements are programmed and, therefore, the order in which the word lines are traversed during programming. A NAND string is typically, but not always, programmed from the source side to the drain side, starting at the source-side word line and proceeding, one word line at a time, to the drain-side word line.

Capacitive coupling effects on a given storage element can be caused by other storage elements in the same word line and in the same NAND string, for instance. For example, storage element 544 may be part of a first group of storage elements, which includes other alternating storage elements along word line WL2, which store a page of data. Storage elements 524 and 564 may be part of a second group of storage elements which store another page of data. When the second group of storage elements is programmed after storage element 544, there will be a capacitive coupling to storage element 544. The coupling is strongest from the direct neighboring storage elements on the word line, which are storage elements 524 and 564.

Similarly, storage element 544 can be affected by programming of storage elements which are on the same NAND string 540 if they are programmed after storage element 544. For storage element 544, the coupling is strongest from the direct neighboring storage elements on the NAND string, which are storage elements 543 and/or 545. For example, if storage elements in the NAND string 540 are programmed in the order: 546, 545, 544, 543, storage element 544 can be affected by coupling from storage element 543. Generally, storage elements which are arranged diagonally with respect to storage element 544, namely storage elements 523, 563, 525 and 565, can provide about 20% of the coupling for storage element 544, whereas the direct neighboring storage elements 524 and 564, and 543 and 545 on the same word line or NAND string provide about 80% of the coupling. The coupling may be enough to shift the $V_{TH}$ of a storage element by about 0.5 V in some cases, which is sufficient to cause a read error and to widen the $V_{TH}$ distribution of a group of storage elements.

Figure 6:
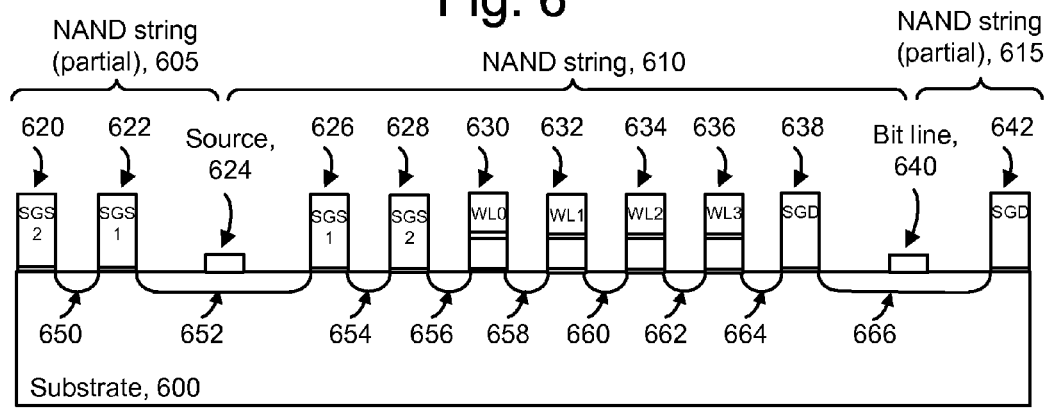

FIGS. 6-10 depict fabrication of non-volatile storage with boost structures. FIG. 6 depicts non-volatile storage. A cross-sectional view along a number of NAND strings is shown. A corresponding structure can be repeated further to the right and left along a bit line direction as well as in a word line direction which extends out of the page. The depiction is simplified and does not necessarily provide all details, nor is the depiction necessarily to scale. In the configuration provided, the NAND strings are arranged alternatingly source-side to source-side and drain-side to drain-side. However, other configurations are possible. The NAND strings can be formed on a substrate 600, at least in part. In one approach, the NAND strings can be formed on a p-well region which is above an n-well region of a p-type substrate.

For example, a partial NAND string 605 includes source-side select gates 620 and 622 which are connected to, or provided as part of, control lines SGS2 and SGS1, respectively, for the associated NAND string. A full NAND string 610 includes source-side select gates 626 and 628 which are connected to, or provided as part of, control lines SGS2 and SGS1, respectively, for the associated NAND string. Also provided are storage elements 630, 632, 634 and 636 and drain-side select gate 638. A partial NAND string 615 includes a drain-side select gate 642 which is connected to, or provided as part of, a control lines SGD for the associated NAND string. Each of the NAND strings 605, 610 and 615 may be located in different blocks of a memory array which are programmed or read at different times, in one approach. Furthermore, source/drain diffusion regions are provided between the storage elements and select gates, including source/drain diffusion regions 650, 652, 654, 656, 658, 660, 662, 664 and 666.

A source line 624 is a control line for providing a voltage to the source-side select gates 622 and 626, while a bit line 640 is a control line for providing a voltage to the drain-side select gates 638 and 642.

Figure 7:
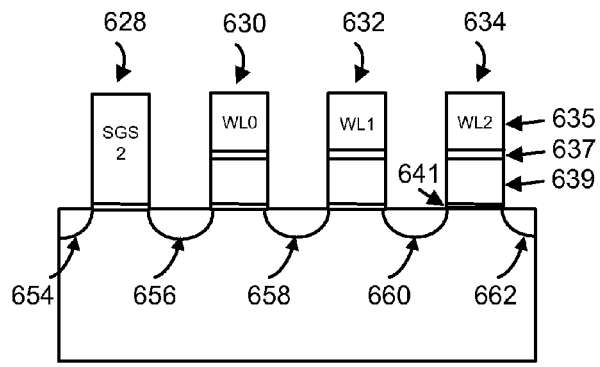

FIG. 7 depicts details of a portion of FIG. 6. Each storage element can include a control gate 635, floating gate 639, inter-poly dielectric layer 637 between the control gate and floating gate, and insulating layer 641 between the floating gate 639 and the substrate 600.

Figure 8:
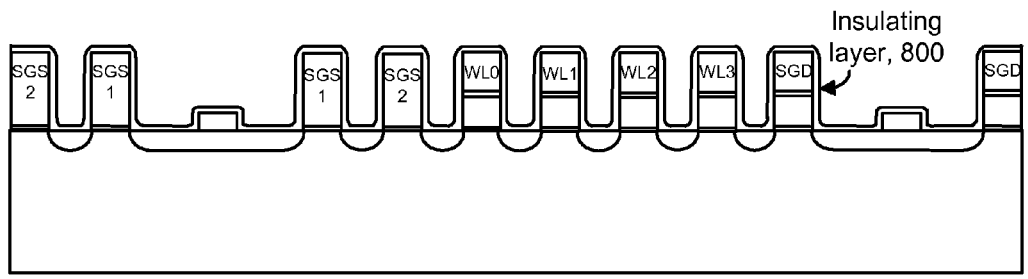

FIG. 8 depicts the non-volatile storage of FIG. 6 after depositing an insulating layer. An insulating layer 800 can be deposited using various techniques. In one approach, the layer extends across each of the NAND strings although in practice it can be sufficient for the insulating layer to extend across the storage elements. Generally, the insulating layer 800 can conform to the shape of the existing structures including the storage elements and select gates. In one approach, the insulating layer 800 can include a triple layer dielectric formed of silicon oxide, silicon nitride and silicon oxide ("ONO").

Figure 9A:
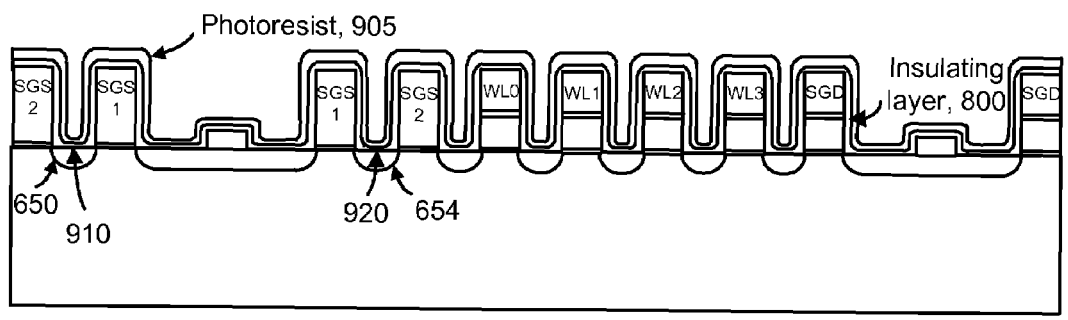
FIG. 9a depicts the non-volatile storage of FIG. 8 after depositing a photo resist layer.
Figure 9B:
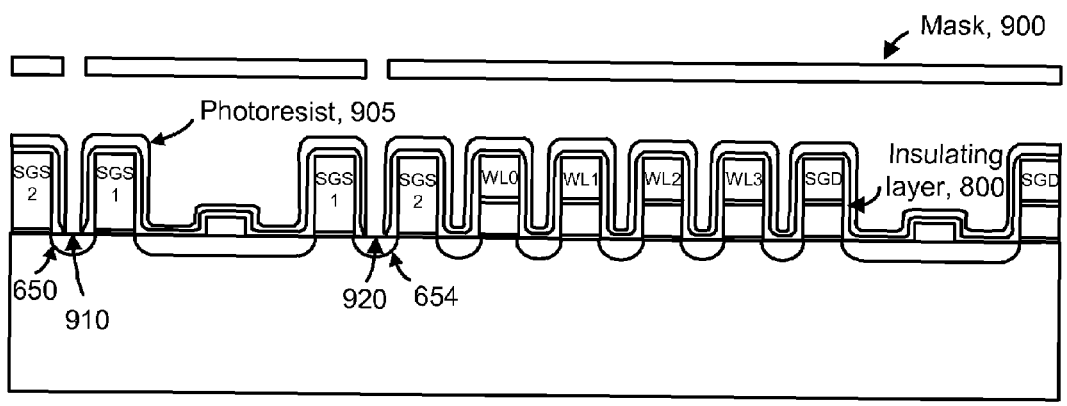
FIG. 9b depicts the non-volatile storage of FIG. 9a after selectively exposing and removing photo resist, and etching portions of the insulating layer.

FIG. 9a depicts the non-volatile storage of FIG. 8 after depositing a photo resist layer 905. FIG. 9b depicts the non-volatile storage of FIG. 9a after selectively exposing and removing portions of the photo resist layer 905, and etching portions of the insulating layer. In this approach, a mask 900 for selectively exposing the photo resist is used which has openings between the source-side select gates of the NAND strings. Once the photo resist layer 905 is selectively exposed, the mask 900 is removed, and, the exposed portions of the photo resist are removed using known techniques. As a result, portions of the insulating layer beneath the removed portions of the photo resist are exposed. Further, an etch is performed to remove these exposed portions of the insulating layer 800 so that corresponding portions 910 and 920 of the source/drain regions 650 and 654, respectively, are exposed. As mentioned, e.g., in connection with FIG. 3, the spacing between the source-side select gates can be a multiple of F to ease tolerances for locating the boost structures' contacts to the substrate. The example provided uses a source-side select gate spacing of F. Following the etch, the remainder of the photo resist layer 905 is removed, and a conductive layer is deposited.

Figure 10:
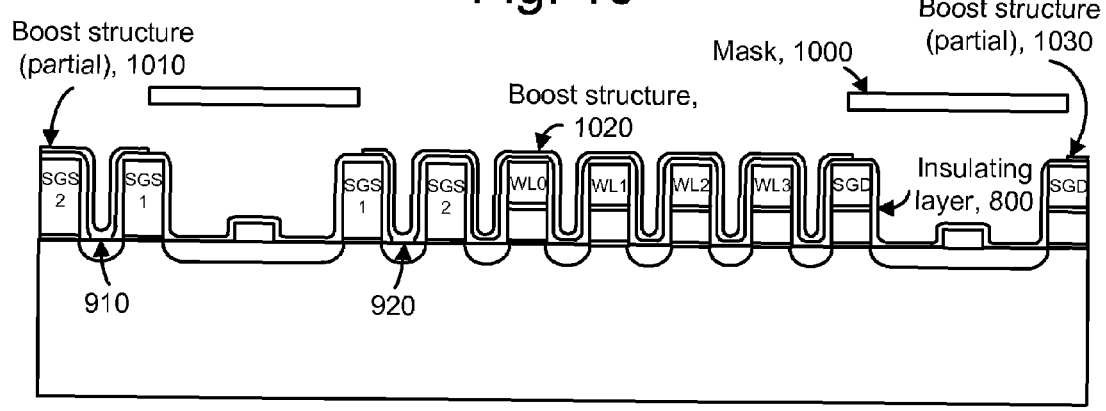

FIG. 10 depicts the non-volatile storage of FIG. 9b after depositing a conductive layer which provides a boost structure. A mask 1000 can be used to deposit a conductive material such as polysilicon or a metal such as Tungsten, Tantalum Nitride or Titanium Nitride over the NAND strings. The conductive material can be deposited using atomic layer deposition (ALD), chemical vapor deposition (CVD), physical vapor deposition (PVD), sputtering, etc. The conductive material provides a boost structure (partial) 1010 which contacts the substrate at source/drain region portion 910, a boost structure 1020 which contacts the substrate at source/drain region portion 920 and a boost structure (partial) 1030. Generally, the boost structures can conform to the shape of the insulating layer 800. The insulating layer 800 serves to insulate the control gates and floating gates of the storage elements from the boost structure. Furthermore, one or more additional layers, such as a second insulating layer, can be provided on top of the boost structures.

One benefit of the boost structure is that it can provide shielding between storage elements to reduce coupling effects since the boost structure can wrap around the control gates and floating gates, extending close to the substrate between the floating gates of adjacent storage elements (FIG. 10). This design also improves coupling from the boost structure to the floating gates of the storage elements.

FIG. 11 is a top view of another embodiment of two adjacent NAND strings with boost structures. FIG. 12 is an equivalent circuit diagram of the NAND strings of FIG. 11. In this embodiment, the NAND strings include a single source-side select gate, e.g., select gate 108 in NAND string #1 and select gate 132 in NAND string #2. A boost structure 1115 in NAND string #1 has a contact to substrate 1118 between the select gate 108 and the adjacent storage element 106, in one possible approach. Similarly, a boost structure 1145 in NAND string #2 has a contact to substrate 1148 between the select gate 132 and the adjacent storage element 134, in one possible approach.

Figure 13:
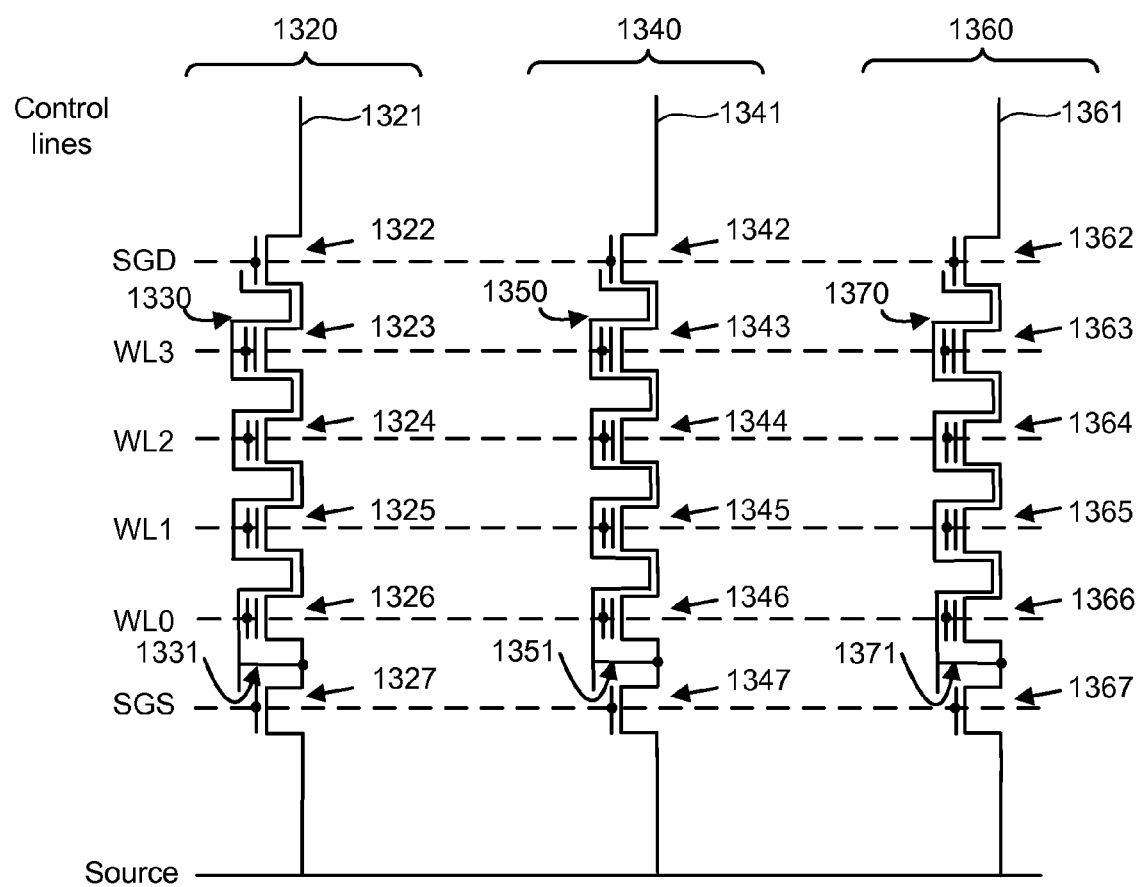
FIG. 13 is a circuit diagram depicting three NAND strings with single source-side select gates and boost structures.

FIG. 13 is a circuit diagram depicting three NAND strings with single source-side select gates and boost structures. The circuit diagram corresponds to the embodiment of FIGS. 11 and 12, and differs from the circuit diagram of FIG. 5 in that the NAND strings include one source-side select gate rather than two. Here, NAND string 1320 includes drain-side select gate 1322, storage elements 1323-1326, source-side select gate 1327, and boost structure 1330 with a contact to substrate 1331. NAND string 1340 includes drain-side select gate 1342, storage elements 1343-1346, source-side select gate 1347, and boost structure 1350 with a contact to substrate 1351. NAND string 1360 includes drain-side select gate 1362, storage elements 1363-1366, source-side select gate 1367, and boost structure 1370 with a contact to substrate 1371. Each NAND string is connected to the source line by a select gate. Selection line or control line SGS is used to control the source-side select gates. The various NAND strings 1320, 1340 and 1360 are connected to respective bit lines 1321, 1341 and 1361, by select transistors in the select-side gates 1322, 1342, 1362, etc. These select transistors are controlled by a drain select line or control line SGD. The NAND strings can be controlled in a manner which is analogous to the embodiment in which the NAND strings include dual select gates at one end. For instance, in one approach, charging of the boost structures can occur via the bit lines.

Figure 14:
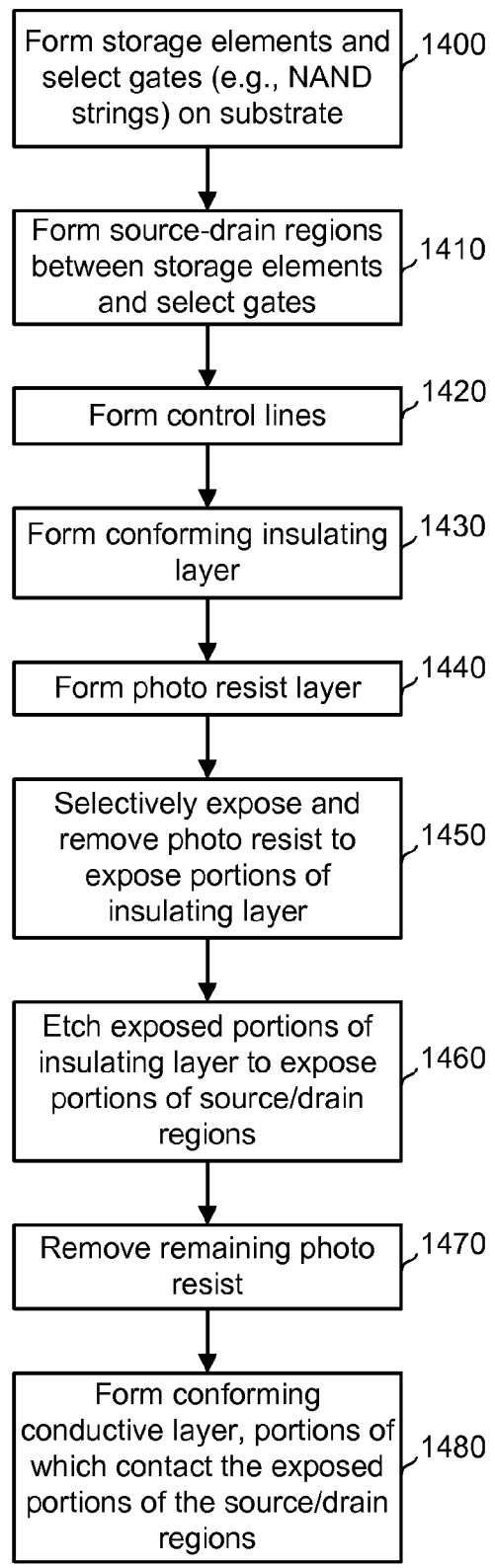
FIG. 14 depicts a process for fabricating non-volatile storage having boost structures.

FIG. 14 depicts a process for fabricating non-volatile storage having boost structures. Note that in this and other flowcharts provided herein, the steps performed are not necessarily performed in the order shown or as discrete steps. Moreover, the process provides a high-level overview. Step 1400 includes forming storage elements and select gates on a substrate (FIG. 6). In one embodiment, NAND strings are formed. Step 1410 includes forming source-drain regions between the storage elements and select gates. Step 1420 includes forming control lines. For example, these may include control lines which control the source- and drain-side select gates and control lines which are coupled to the source contacts and bit lines. Step 1430 includes forming a conforming insulating layer over the storage elements and at least a portion of the select gates (FIG. 8). Step 1440 includes forming a photo resist layer (FIG. 9*a*). Step 1450 includes selectively exposing the photo resist layer, e.g., via mask 900, and removing the exposed portions of the photo resist to expose portions of the insulating layer (FIG. 9*b*). Step 1460 includes etching the exposed portions of the insulating layer to expose portions of the source/drain regions (FIG. 9*b*). Step 1470 includes removing the remaining photo resist. Step 1480 includes forming a conforming conductive layer, portions of which contact the exposed portions of the source-drain regions (FIG. 10). An additional insulating layer can be provided over the conductive layer as well.

Figure 15:
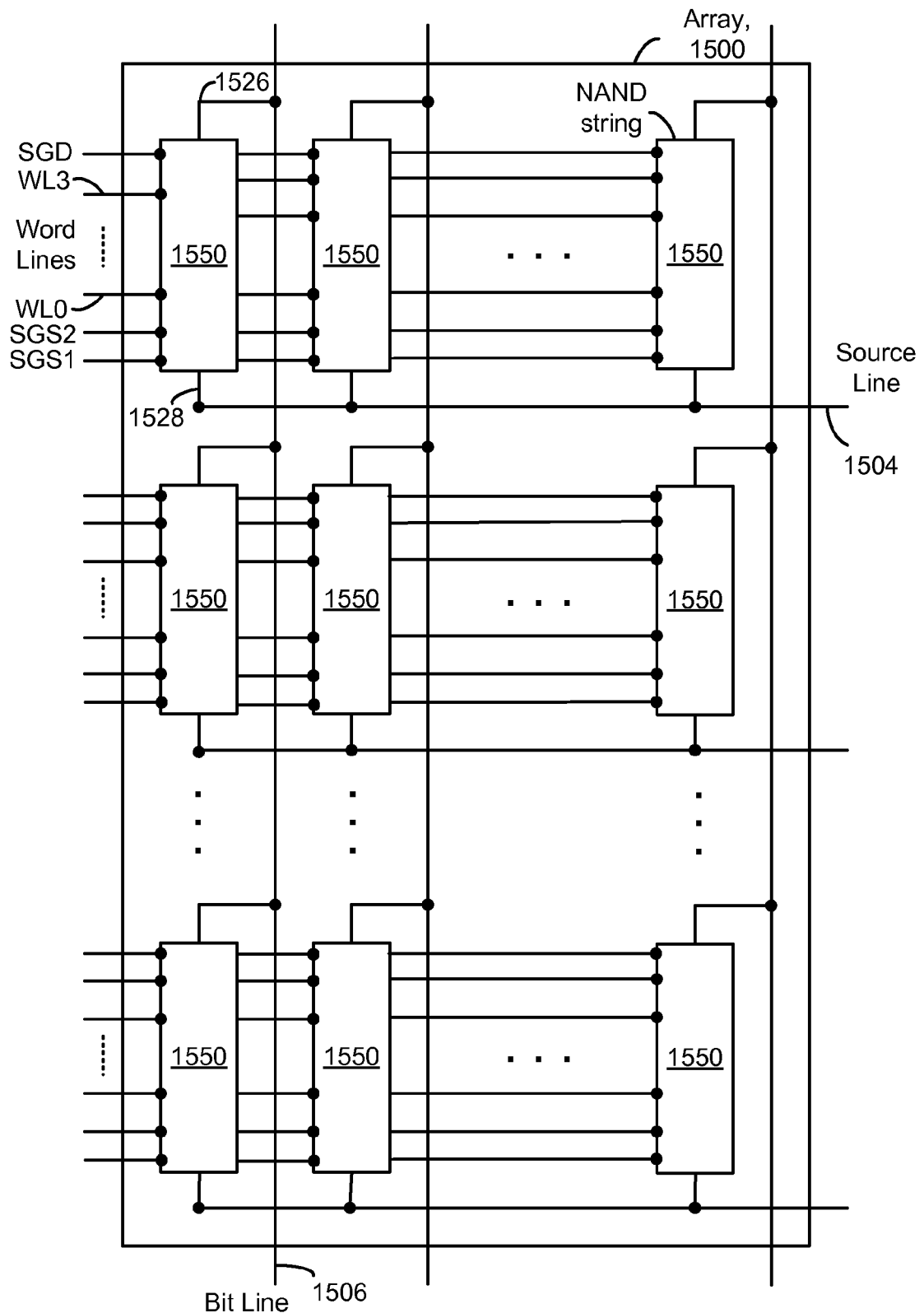
FIG. 15 is a block diagram of an array of NAND flash storage elements.

FIG. 15 illustrates an example of an array 1500 of NAND storage elements, such as those shown in FIGS. 1-4, 11 and 12. Along each column, a bit line 1506 is coupled to the drain terminal 1526 of the drain select gate for the NAND string 1550. Along each row of NAND strings, a source line 1504 may connect all the source terminals 1528 of the source-side select gates of the NAND strings. An example of a NAND architecture array and its operation as part of a memory system is found in U.S. Pat. Nos. 5,570,315; 5,774,397; and 6,046,935.

The array of storage elements is divided into a large number of blocks of storage elements. As is common for flash EEPROM systems, the block is the unit of erase. That is, each block contains the minimum number of storage elements that are erased together. Each block is typically divided into a number of pages. A page is a unit of programming. In one embodiment, the individual pages may be divided into segments and the segments may contain the fewest number of storage elements that are written at one time as a basic programming operation. One or more pages of data are typically stored in one row of storage elements. A page can store one or more sectors. A sector includes user data and overhead data. Overhead data typically includes an Error Correction Code (ECC) that has been calculated from the user data of the sector. A portion of the controller (described below) calculates the ECC when data is being programmed into the array, and also checks it when data is being read from the array. Alternatively, the ECCs and/or other overhead data are stored in different pages, or even different blocks, than the user data to which they pertain.

A sector of user data is typically 512 bytes, corresponding to the size of a sector in magnetic disk drives. Overhead data is typically an additional 16-20 bytes. A large number of pages form a block, anywhere from 8 pages, for example, up to 32, 64, 128 or more pages. In some embodiments, a row of NAND strings comprises a block.

Memory storage elements are erased in one embodiment by raising the p-well to an erase voltage (e.g., 20 V) for a sufficient period of time and grounding the word lines of a selected block while the source and bit lines are floating. Due to capacitive coupling, the unselected word lines, bit lines, select lines, and c-source are also raised to a significant fraction of the erase voltage. A strong electric field is thus applied to the tunnel oxide layers of selected storage elements and the data of the selected storage elements are erased as electrons of the floating gates are emitted to the substrate side, typically by Fowler-Nordheim tunneling mechanism. As electrons are transferred from the floating gate to the p-well region, the threshold voltage of a selected storage element is lowered. Erasing can be performed on the entire memory array, separate blocks, or another unit of storage elements.

Figure 16:
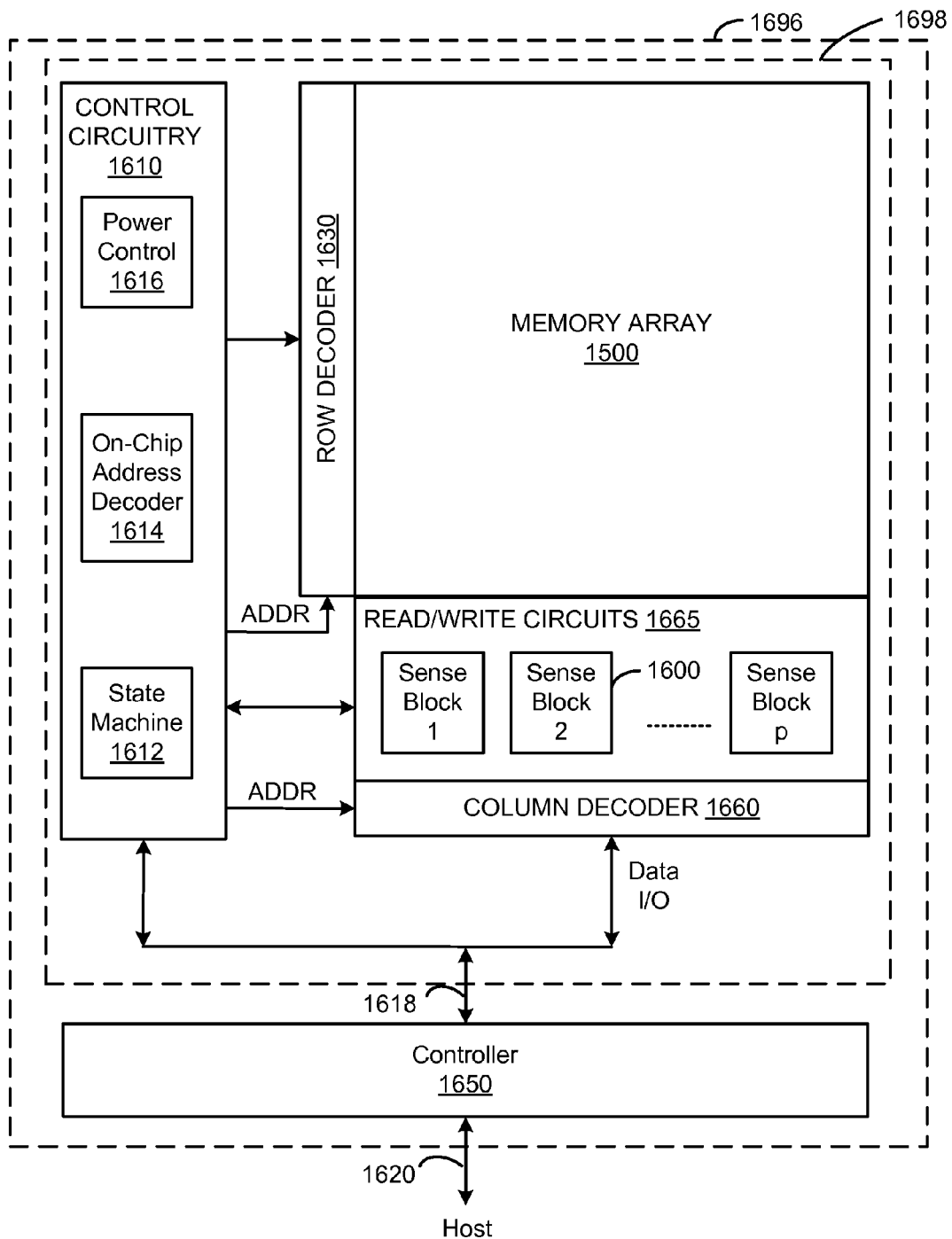
FIG. 16 is a block diagram of a non-volatile memory system using single row/column decoders and read/write circuits.

FIG. 16 is a block diagram of a non-volatile memory system using single row/column decoders and read/write circuits. The memory device 1696 has read/write circuits for reading and programming a page of storage elements in parallel, according to one embodiment of the present invention. Memory device 1696 may include one or more memory die 1698. Memory die 1698 includes a two-dimensional array of storage elements 1500, control circuitry 1610, and read/write circuits 1665. In some embodiments, the array of storage elements can be three dimensional. The memory array 1500 is addressable by word lines via a row decoder 1630 and by bit lines via a column decoder 1660. The read/write circuits 1665 include multiple sense blocks 1600 and allow a page of storage elements to be read or programmed in parallel. Typically a controller 1650 is included in the same memory device 1696 (e.g., a removable storage card) as the one or more memory die 1698. Commands and Data are transferred between the host and controller 1650 via lines 1620 and between the controller and the one or more memory die 1698 via lines 1618.

The control circuitry 1610 cooperates with the read/write circuits 1665 to perform memory operations on the memory array 1500. The control circuitry 1610 includes a state machine 1612, an on-chip address decoder 1614 and a power control module 1619. The state machine 1612 provides chip-level control of memory operations. The on-chip address decoder 1614 provides an address interface between that used by the host or a memory controller to the hardware address used by the decoders 1630 and 1660. The power control module 1616 controls the power and voltages supplied to the word lines and bit lines during memory operations.

In some implementations, some of the components can be combined. In various designs, one or more of the components of (alone or in combination), other than storage element array 1500, can be thought of as a managing circuit. For example, one or more managing circuits may include any one of or a combination of control circuitry 1610, state machine 1612, decoders 1614, 1630 and 1660, power control 1616, sense blocks 1600, read/write circuits 1665, controller 1650, etc.

Figure 17:
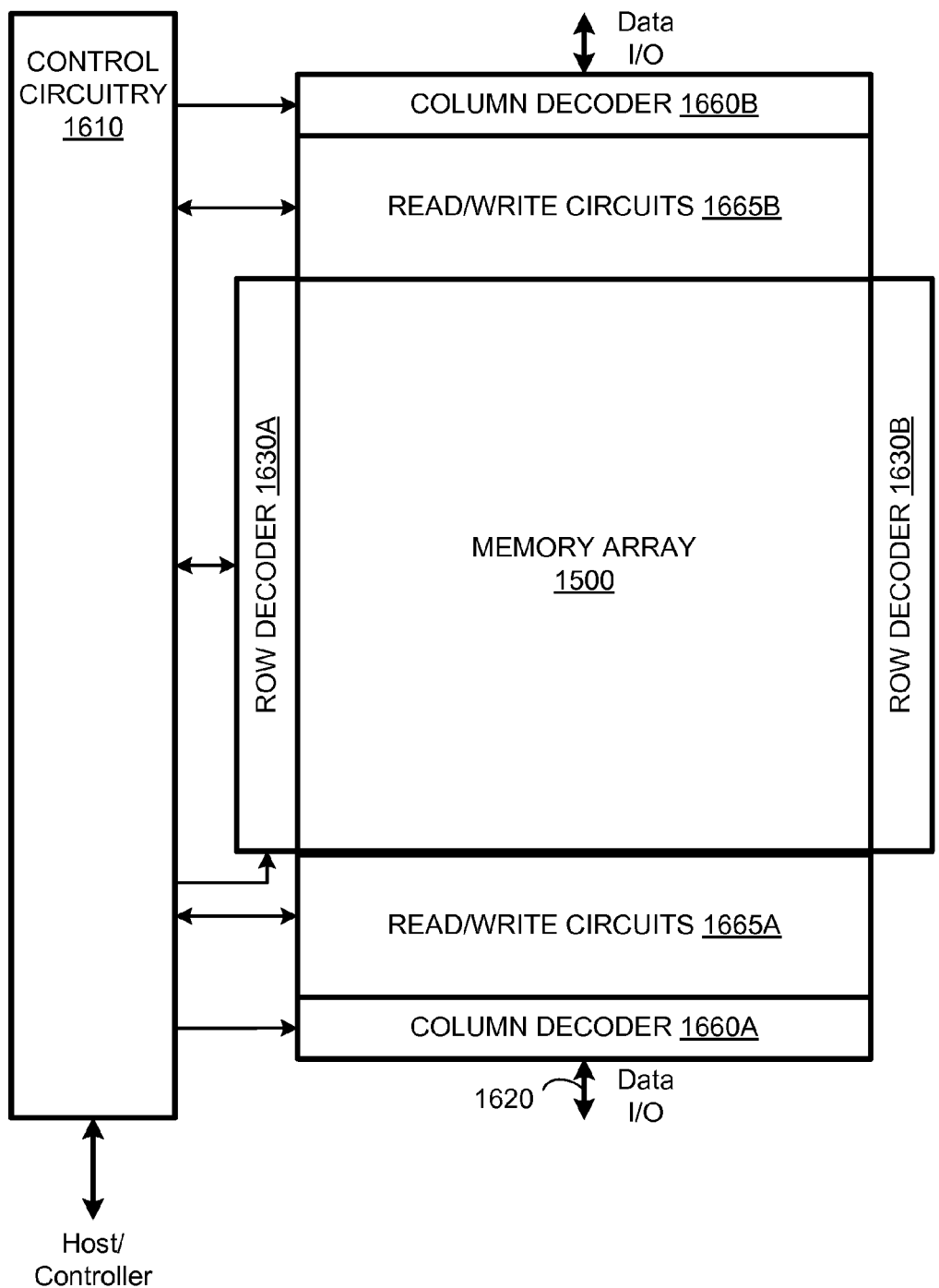
FIG. 17 is a block diagram of a non-volatile memory system using dual row/column decoders and read/write circuits.

FIG. 17 is a block diagram of a non-volatile memory system using dual row/column decoders and read/write circuits. Another arrangement of the memory device 1696 shown in FIG. 16 is provided. Here, access to the memory array 1500 by the various peripheral circuits is implemented in a symmetric fashion, on opposite sides of the array, so that the densities of access lines and circuitry on each side are reduced by half. Thus, the row decoder is split into row decoders 1630A and 1630B and the column decoder into column decoders 1660A and 1660B. Similarly, the read/write circuits are split into read/write circuits 1665A connecting to bit lines from the bottom and read/write circuits 1665B connecting to bit lines from the top of the array 1500. In this way, the density of the read/write modules is essentially reduced by one half. The device of FIG. 17 can also include a controller, as described above for the device of FIG. 16.

Figure 18:
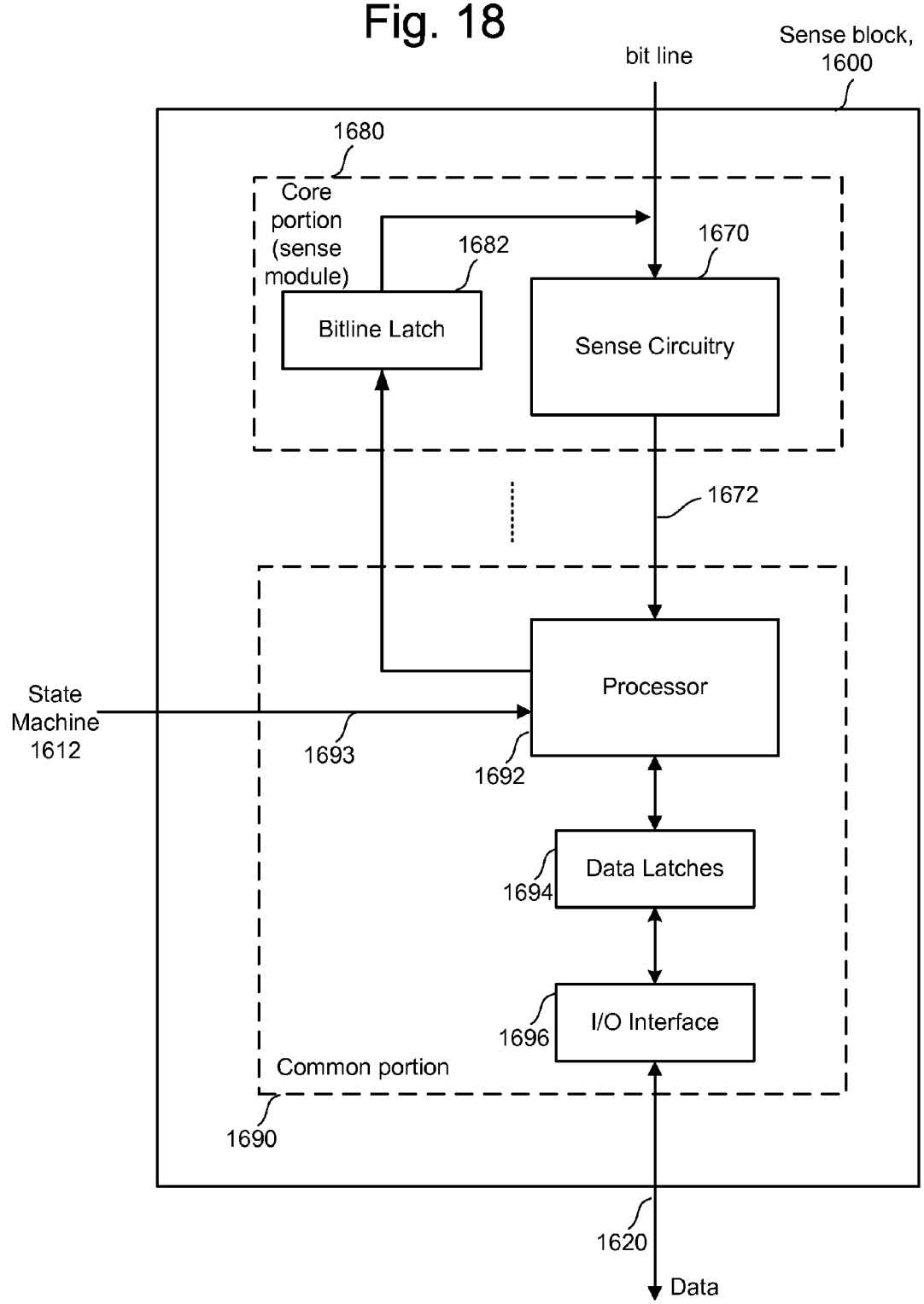
FIG. 18 is a block diagram depicting one embodiment of a sense block.

FIG. 18 is a block diagram of an individual sense block 1600 partitioned into a core portion, referred to as a sense module 1680, and a common portion 1690. In one embodiment, there will be a separate sense module 1680 for each bit line and one common portion 1690 for a set of multiple sense modules 1680. In one example, a sense block will include one common portion 1690 and eight sense modules 1680. Each of the sense modules in a group will communicate with the associated common portion via a data bus 1672. For further details refer to U.S. Patent Application Pub. No. 2006/0140007, title "Non-Volatile Memory & Method with Shared Processing for an Aggregate of Sense Amplifiers" published Jun. 29, 2006, incorporated herein by reference in its entirety.

Sense module 1680 comprises sense circuitry 1670 that determines whether a conduction current in a connected bit line is above or below a predetermined threshold level. Sense module 1680 also includes a bit line latch 1682 that is used to set a voltage condition on the connected bit line. For example, a predetermined state latched in bit line latch 1682 will result in the connected bit line being pulled to a state designating program inhibit (e.g., $V_{DD}$).

Common portion 1690 comprises a processor 1692, a set of data latches 1694 and an I/O Interface 1696 coupled between the set of data latches 1694 and data bus 1620. Processor 1692 performs computations. For example, one of its functions is to determine the data stored in the sensed storage element and store the determined data in the set of data latches. The set of data latches 1694 is used to store data bits determined by processor 1692 during a read operation. It is also used to store data bits imported from the data bus 1620 during a program operation. The imported data bits represent write data meant to be programmed into the memory. I/O interface 1696 provides an interface between data latches 1694 and the data bus 1620.

During read or sensing, the operation of the system is under the control of state machine 1612 that controls the supply of different control gate voltages to the addressed storage element. As it steps through the various predefined control gate voltages corresponding to the various memory states supported by the memory, the sense module 1680 may trip at one of these voltages and an output will be provided from sense module 1680 to processor 1692 via bus 1672. At that point, processor 1692 determines the resultant memory state by consideration of the tripping event(s) of the sense module and the information about the applied control gate voltage from the state machine via input lines 1693. It then computes a binary encoding for the memory state and stores the resultant data bits into data latches 1694. In another embodiment of the core portion, bit line latch 1682 serves double duty, both as a latch for latching the output of the sense module 1680 and also as a bit line latch as described above.

It is anticipated that some implementations will include multiple processors 1692. In one embodiment, each processor 1692 will include an output line (not depicted in FIG. 15) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data zero (or a data one inverted), then the state machine knows to terminate the programming process. Because each processor communicates with eight sense modules, the state machine needs to read the wired-OR line eight times, or logic is added to processor 1692 to accumulate the results of the associated bit lines such that the state machine need only read the wired-OR line one time. Similarly, by choosing the logic levels correctly, the global state machine can detect when the first bit changes its state and change the algorithms accordingly.

During program or verify, the data to be programmed is stored in the set of data latches 1694 from the data bus 1620. The program operation, under the control of the state machine, comprises a series of programming voltage pulses applied to the control gates of the addressed storage elements. Each programming pulse is followed by a read back (verify) to determine if the storage element has been programmed to the desired memory state. Processor 1692 monitors the read back memory state relative to the desired memory state. When the two are in agreement, the processor 1692 sets the bit line latch 1682 so as to cause the bit line to be pulled to a state designating program inhibit. This inhibits the storage element coupled to the bit line from further programming even if programming pulses appear on its control gate. In other embodiments the processor initially loads the bit line latch 1682 and the sense circuitry sets it to an inhibit value during the verify process.

Data latch stack 1694 contains a stack of data latches corresponding to the sense module. In one embodiment, there are three data latches per sense module 1680. In some implementations (but not required), the data latches are implemented as a shift register so that the parallel data stored therein is converted to serial data for data bus 1620, and vice versa. In the preferred embodiment, all the data latches corresponding to the read/write block of m storage elements can be linked together to form a block shift register so that a block of data can be input or output by serial transfer. In particular, the bank of r read/write modules is adapted so that each of its set of data latches will shift data in to or out of the data bus in sequence as if they are part of a shift register for the entire read/write block.

Additional information about the structure and/or operations of various embodiments of non-volatile storage devices can be found in: (1) U.S. Patent Application Pub. No. 2004/0057287, "Non-Volatile Memory And Method With Reduced Source Line Bias Errors," published on Mar. 25, 2004; (2) U.S. Patent Application Pub No. 2004/0109357, "Non-Volatile Memory And Method with Improved Sensing," published on Jun. 10, 2004; (3) U.S. patent application Ser. No. 11/015,199 titled "Improved Memory Sensing Circuit And Method For Low Voltage Operation," filed on Dec. 16, 2004; (4) U.S. patent application Ser. No. 11/099,133, titled "Compensating for Coupling During Read Operations of Non-Volatile Memory," filed on Apr. 5, 2005; and (5) U.S. patent application Ser. No. 11/321,953, titled "Reference Sense Amplifier For Non-Volatile Memory, filed on Dec. 28, 2005. All five of the immediately above-listed patent documents are incorporated herein by reference in their entirety.

Figure 19:
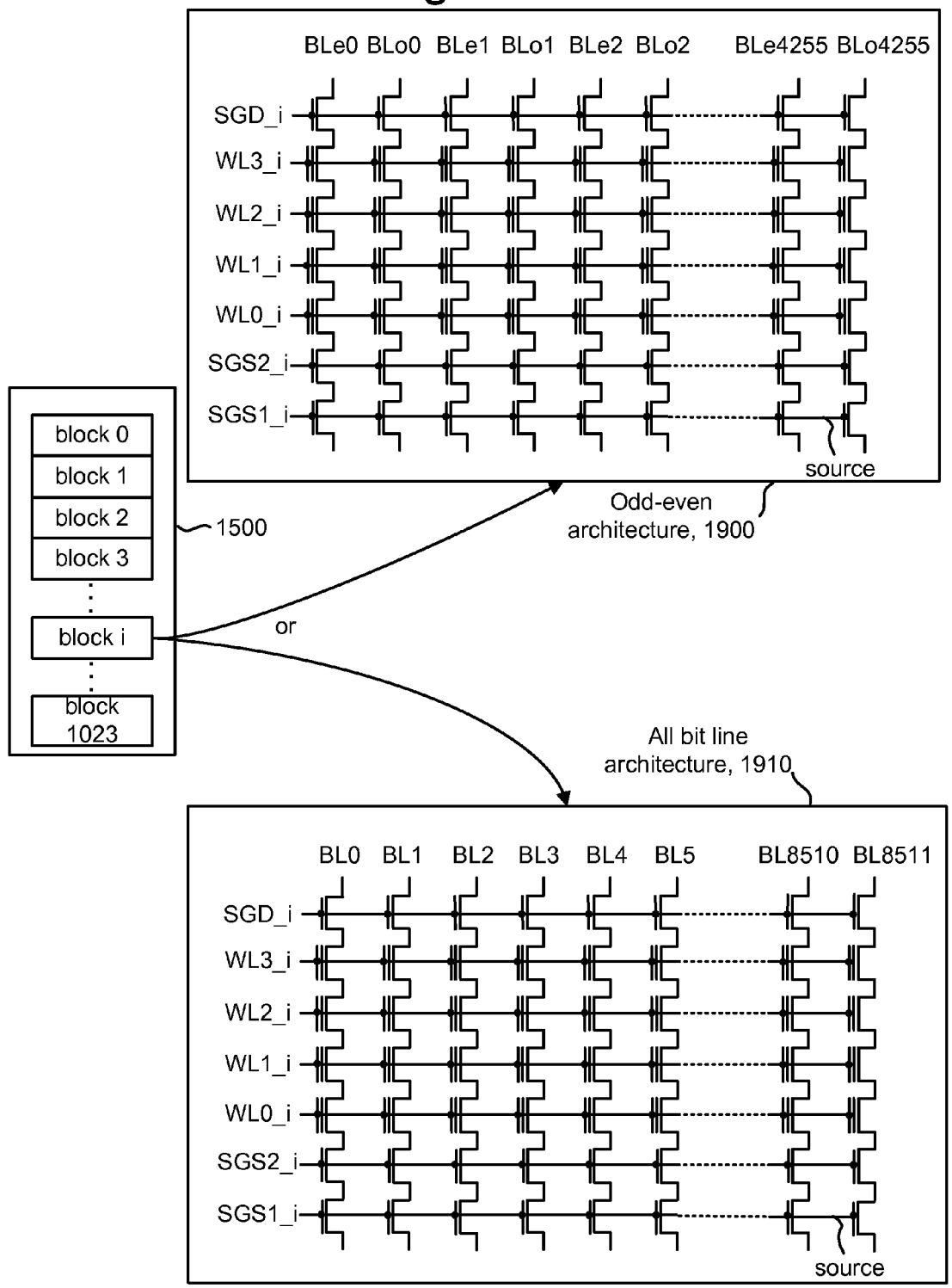
FIG. 19 illustrates an example of an organization of a memory array into blocks for an all bit line memory architecture or for an odd-even memory architecture.

FIG. 19 illustrates an example of an organization of a memory array into blocks for an all bit line memory architecture or for an odd-even memory architecture. Exemplary structures of storage element array 1500 are described. As one example, a NAND flash EEPROM is described that is partitioned into 1,024 blocks. The data stored in each block can be simultaneously erased. In one embodiment, the block is the minimum unit of storage elements that are simultaneously erased. In each block, in this example, there are 8,512 columns corresponding to bit lines BL0, BL1, . . . BL8511. In one embodiment referred to as an all bit line (ABL) architecture (architecture 1910), all the bit lines of a block can be simultaneously selected during read and program operations. Storage elements along a common word line and connected to any bit line can be programmed at the same time.

In the example provided, four storage elements are connected in series to form a NAND string. Although four storage elements are shown to be included in each NAND string, more or less than four can be used (e.g., 16, 32, 64 or another number). One terminal of the NAND string is connected to a corresponding bit line via a drain select gate, and another terminal is connected to c-source via a source-side select gate.

In another embodiment, referred to as an odd-even architecture (architecture 1900), the bit lines are divided into even bit lines (BLe) and odd bit lines (BLo). In the odd/even bit line architecture, storage elements along a common word line and connected to the odd bit lines are programmed at one time, while storage elements along a common word line and connected to even bit lines are programmed at another time. Data can be programmed into different blocks and read from different blocks concurrently. In each block, in this example, there are 8,512 columns that are divided into even columns and odd columns. In this example, four storage elements are shown connected in series to form a NAND string. Although four storage elements are shown to be included in each NAND string, more or fewer than four storage elements can be used.

During one configuration of read and programming operations, 4,256 storage elements are simultaneously selected. The storage elements selected have the same word line and the same kind of bit line (e.g., even or odd). Therefore, 532 bytes of data, which form a logical page, can be read or programmed simultaneously, and one block of the memory can store at least eight logical pages (four word lines, each with odd and even pages). For multi-state storage elements, when each storage element stores two bits of data, where each of these two bits are stored in a different page, one block stores sixteen logical pages. Other sized blocks and pages can also be used.

For either the ABL or the odd-even architecture, storage elements can be erased by raising the p-well to an erase voltage (e.g., 20V) and grounding the word lines of a selected block. The source and bit lines are floating. Erasing can be performed on the entire memory array, separate blocks, or another unit of the storage elements which is a portion of the memory device. Electrons are transferred from the floating gates of the storage elements to the p-well region so that the $V_{TH}$ of the storage elements becomes negative.

In the read and verify operations, the select gates (SGD and SGS) are connected to a voltage in a range of 2.5 to 4.5 V and the unselected word lines (e.g., WL0, WL1 and WL3, when WL2 is the selected word line) are raised to a read pass voltage, $V_{PASS}$, (typically a voltage in the range of 4.5 to 6 V) to make the transistors operate as pass gates. The selected word line WL2 is connected to a voltage, a level of which is specified for each read and verify operation in order to determine whether a $V_{TH}$ of the concerned storage element is above or below such level. For example, in a read operation for a two-level storage element, the selected word line WL2 may be grounded, so that it is detected whether the $V_{TH}$ is higher than 0 V. In a verify operation for a two level storage element, with no boost structure, the selected word line WL2 is connected to 0.8 V, for example, so that it is verified whether or not the $V_{TH}$ has reached at least 0.8 V. The source and p-well are at 0 V. The selected bit lines, assumed to be the even bit lines (BLe), are pre-charged to a level of, for example, 0.7 V. If the $V_{TH}$ is higher than the read or verify level on the word line, the potential level of the bit line (BLe) associated with the storage element of interest maintains the high level because of the non-conductive storage element. On the other hand, if the $V_{TH}$ is lower than the read or verify level, the potential level of the concerned bit line (BLe) decreases to a low level, for example, less than 0.5 V, because the conductive storage element discharges the bit line. The state of the storage element can thereby be detected by a voltage comparator sense amplifier that is connected to the bit line.

The erase, read and verify operations described above are performed according to techniques known in the art. Thus, many of the details explained can be varied by one skilled in the art. Other erase, read and verify techniques known in the art can also be used.

Figure 20:
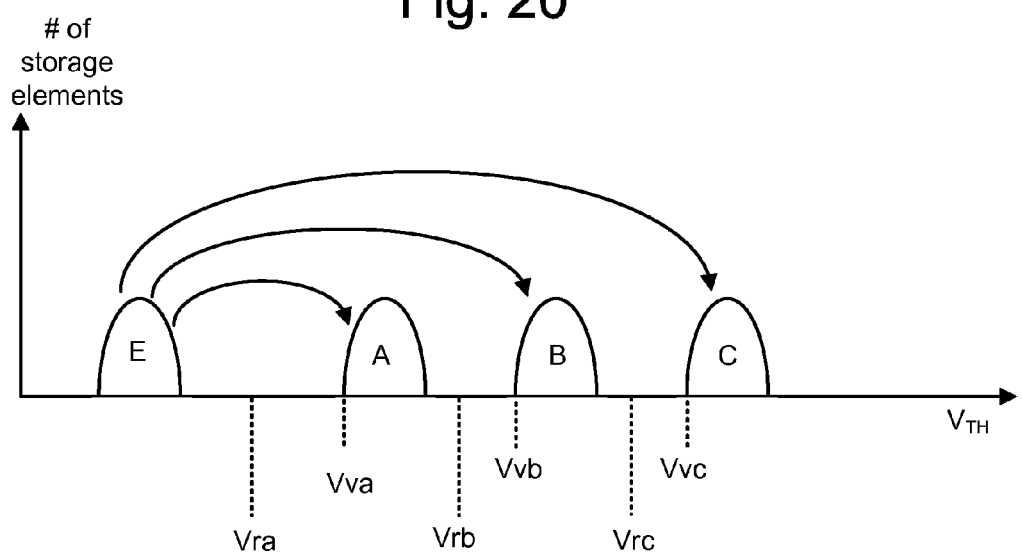
FIG. 20 depicts an example set of threshold voltage distributions.

FIG. 20 illustrates example threshold voltage distributions for the storage element array when each storage element stores two bits of data. A first threshold voltage distribution E is provided for erased storage elements. Three threshold voltage distributions, A, B and C for programmed storage elements, are also depicted. In one embodiment, the threshold voltages in the E distribution are negative and the threshold voltages in the A, B and C distributions are positive.

Each distinct threshold voltage range corresponds to predetermined values for the set of data bits. The specific relationship between the data programmed into the storage element and the threshold voltage levels of the storage element depends upon the data encoding scheme adopted for the storage elements. For example, U.S. Pat. No. 6,222,762 and U.S. Patent Application Pub. No. 2004/0255090, published Dec. 16, 2004, both of which are incorporated herein by reference in their entirety, describe various data encoding schemes for multi-state flash storage elements. In one embodiment, data values are assigned to the threshold voltage ranges using a Gray code assignment so that if the threshold voltage of a floating gate erroneously shifts to its neighboring physical state, only one bit will be affected. One example assigns "11" to threshold voltage range E (state E), "10" to threshold voltage range A (state A), "00" to threshold voltage range B (state B) and "01" to threshold voltage range C (state C). However, in other embodiments, Gray code is not used. Although four states are shown, the present invention can also be used with other multi-state structures including those that include more or less than four states.

Three read reference voltages, Vra, Vrb and Vrc, are also provided for reading data from storage elements. By testing whether the threshold voltage of a given storage element is above or below Vra, Vrb and Vrc, the system can determine what state the storage element is in.

Further, three verify reference voltages, Vva, Vvb and Vvc, are provided. When programming storage elements to state A, the system will test whether those storage elements have a threshold voltage greater than or equal to Vva. When programming storage elements to state B, the system will test whether the storage elements have threshold voltages greater than or equal to Vvb. When programming storage elements to state C, the system will determine whether storage elements have their threshold voltage greater than or equal to Vvc.

In one embodiment, known as full sequence programming, storage elements can be programmed from the erase state E directly to any of the programmed states A, B or C. For example, a population of storage elements to be programmed may first be erased so that all storage elements in the population are in erased state E. A series of programming pulses such as depicted by the control gate voltage sequence of FIG.

26 will then be used to program storage elements directly into states A, B or C. While some storage elements are being programmed from state E to state A, other storage elements are being programmed from state E to state B and/or from state E to state C. When programming from state E to state C on WLn, the amount of parasitic coupling to the adjacent floating gate under WLn−1 is a maximized since the change in amount of charge on the floating gate under WLn is largest as compared to the change in voltage when programming from state E to state A or state E to state B. When programming from state E to state B the amount of coupling to the adjacent floating gate is reduced but still significant. When programming from state E to state A the amount of coupling is reduced even further. Consequently the amount of correction required to subsequently read each state of WLn−1 will vary depending on the state of the adjacent storage element on WLn.

Figure 21:
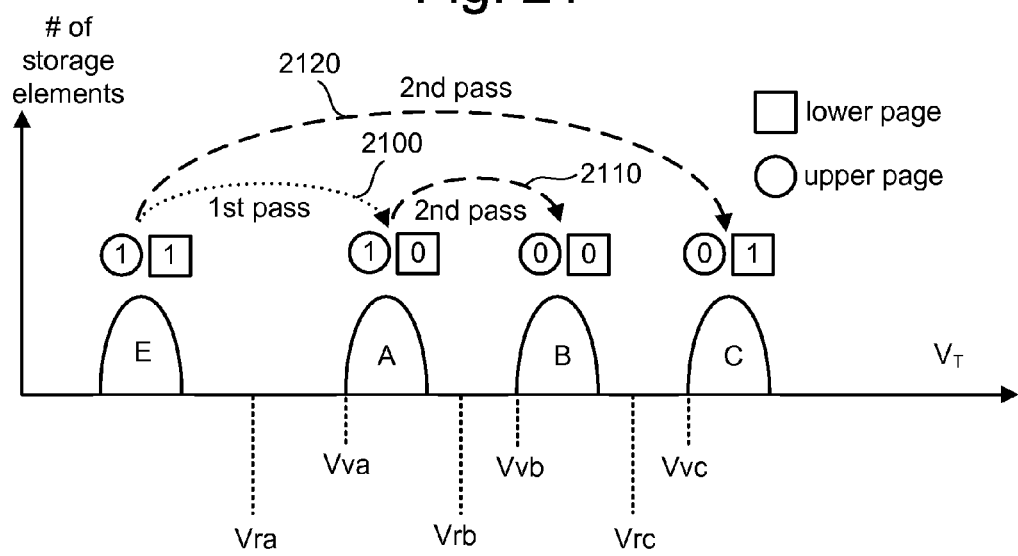
FIG. 21 depicts another example set of threshold voltage distributions.

FIG. 21 illustrates an example of a two-pass technique of programming a multi-state storage element that stores data for two different pages: a lower page and an upper page. Four states are depicted: state E (11), state A (10), state B (00) and state C (01). For state E, both pages store a "1." For state A, the lower page stores a "0" and the upper page stores a "1." For state B, both pages store "0." For state C, the lower page stores "1" and the upper page stores "0." Note that although specific bit patterns have been assigned to each of the states, different bit patterns may also be assigned.

In a first programming pass, the storage element's threshold voltage level is set according to the bit to be programmed into the lower logical page. If that bit is a logic "1," the threshold voltage is not changed since it is in the appropriate state as a result of having been earlier erased. However, if the bit to be programmed is a logic "0," the threshold level of the storage element is increased to be state A, as shown by arrow 2100. That concludes the first programming pass.

In a second programming pass, the storage element's threshold voltage level is set according to the bit being programmed into the upper logical page. If the upper logical page bit is to store a logic "1," then no programming occurs since the storage element is in one of the states E or A, depending upon the programming of the lower page bit, both of which carry an upper page bit of "1." If the upper page bit is to be a logic "0," then the threshold voltage is shifted. If the first pass resulted in the storage element remaining in the erased state E, then in the second phase the storage element is programmed so that the threshold voltage is increased to be within state C, as depicted by arrow 2120. If the storage element had been programmed into state A as a result of the first programming pass, then the storage element is further programmed in the second pass so that the threshold voltage is increased to be within state B, as depicted by arrow 2110. The result of the second pass is to program the storage element into the state designated to store a logic "0" for the upper page without changing the data for the lower page. In both FIG. 20 and FIG. 21 the amount of coupling to the floating gate on the adjacent word line depends on the final state.

In one embodiment, a system can be set up to perform full sequence writing if enough data is written to fill up an entire page. If not enough data is written for a full page, then the programming process can program the lower page programming with the data received. When subsequent data is received, the system will then program the upper page. In yet another embodiment, the system can start writing in the mode that programs the lower page and convert to full sequence programming mode if enough data is subsequently received to fill up an entire (or most of a) word line's storage elements. More details of such an embodiment are disclosed in U.S. Patent Application Pub. No. 2006/0126390, titled "Pipelined Programming of Non-Volatile Memories Using Early Data," published Jun. 15, 2006, and incorporated herein by reference in its entirety.

Figure 22A:
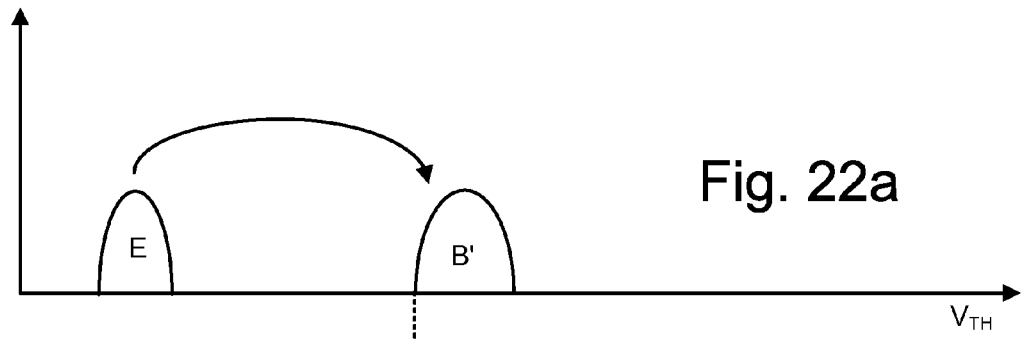
FIGS. 22a-c show various threshold voltage distributions and describe a process for programming non-volatile memory.
Figure 22B:
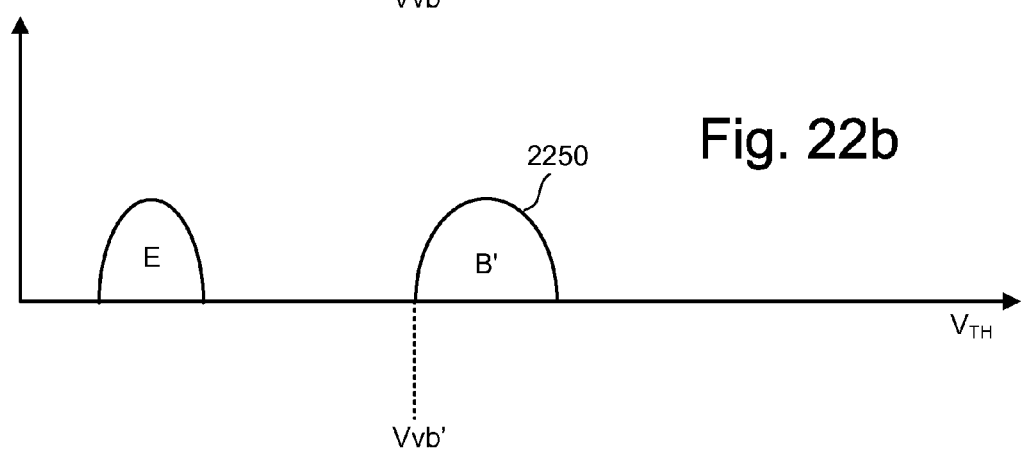
Figure 22C:
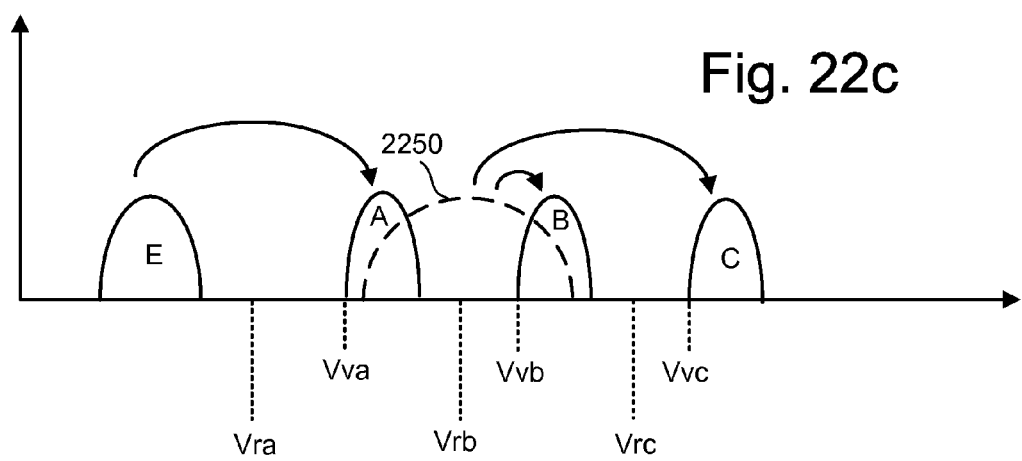

FIGS. 22*a-c* disclose another process for programming non-volatile memory that reduces the effect of floating gate to floating gate coupling by, for any particular storage element, writing to that particular storage element with respect to a particular page subsequent to writing to adjacent storage elements for previous pages. In one example implementation, the non-volatile storage elements store two bits of data per storage element, using four data states. For example, assume that state E is the erased state and states A, B and C are the programmed states. State E stores data 11. State A stores data 01. State B stores data 10. State C stores data 00. This is an example of non-Gray coding because both bits change between adjacent states A and B. Other encodings of data to physical data states can also be used. Each storage element stores two pages of data. For reference purposes, these pages of data will be called upper page and lower page; however, they can be given other labels. With reference to state A, the upper page stores bit 0 and the lower page stores bit 1. With reference to state B, the upper page stores bit 1 and the lower page stores bit 0. With reference to state C, both pages store bit data 0.

The programming process is a two-step process. In the first step, the lower page is programmed. If the lower page is to remain data 1, then the storage element state remains at state E. If the data is to be programmed to 0, then the threshold of voltage of the storage element is raised such that the storage element is programmed to state B'. FIG. 22*a* therefore shows the programming of storage elements from state E to state B'. State B' is an interim state B; therefore, the verify point is depicted as Vvb', which is lower than Vvb.

In one embodiment, after a storage element is programmed from state E to state B', its neighbor storage element (WLn+1) in the NAND string will then be programmed with respect to its lower page. For example, looking back at FIG. 5, after the lower page for storage element 546 is programmed, the lower page for storage element 545 would be programmed. After programming storage element 545, the floating gate to floating gate coupling effect will raise the apparent threshold voltage of storage element 546 if storage element 545 had a threshold voltage raised from state E to state B'. This will have the effect of widening the threshold voltage distribution for state B' to that depicted as threshold voltage distribution 2250 of FIG. 22*b*. This apparent widening of the threshold voltage distribution will be remedied when programming the upper page.

FIG. 22*c* depicts the process of programming the upper page. If the storage element is in erased state E and the upper page is to remain at 1, then the storage element will remain in state E. If the storage element is in state E and its upper page data is to be programmed to 0, then the threshold voltage of the storage element will be raised so that the storage element is in state A. If the storage element was in intermediate threshold voltage distribution 2250 and the upper page data is to remain at 1, then the storage element will be programmed to final state B. If the storage element is in intermediate threshold voltage distribution 2250 and the upper page data is to become data 0, then the threshold voltage of the storage element will be raised so that the storage element is in state C. The process depicted by FIGS. 22*a-c* reduces the effect of floating gate to floating gate coupling because only the upper page programming of neighbor storage elements will have an effect on the apparent threshold voltage of a given storage element. An example of an alternate state coding is to move from distribution 2250 to state C when the upper page data is a 1, and to move to state B when the upper page data is a 0.

Although FIGS. 22a-c provide an example with respect to four data states and two pages of data, the concepts taught can be applied to other implementations with more or less than four states and different than two pages.

Figure 23:
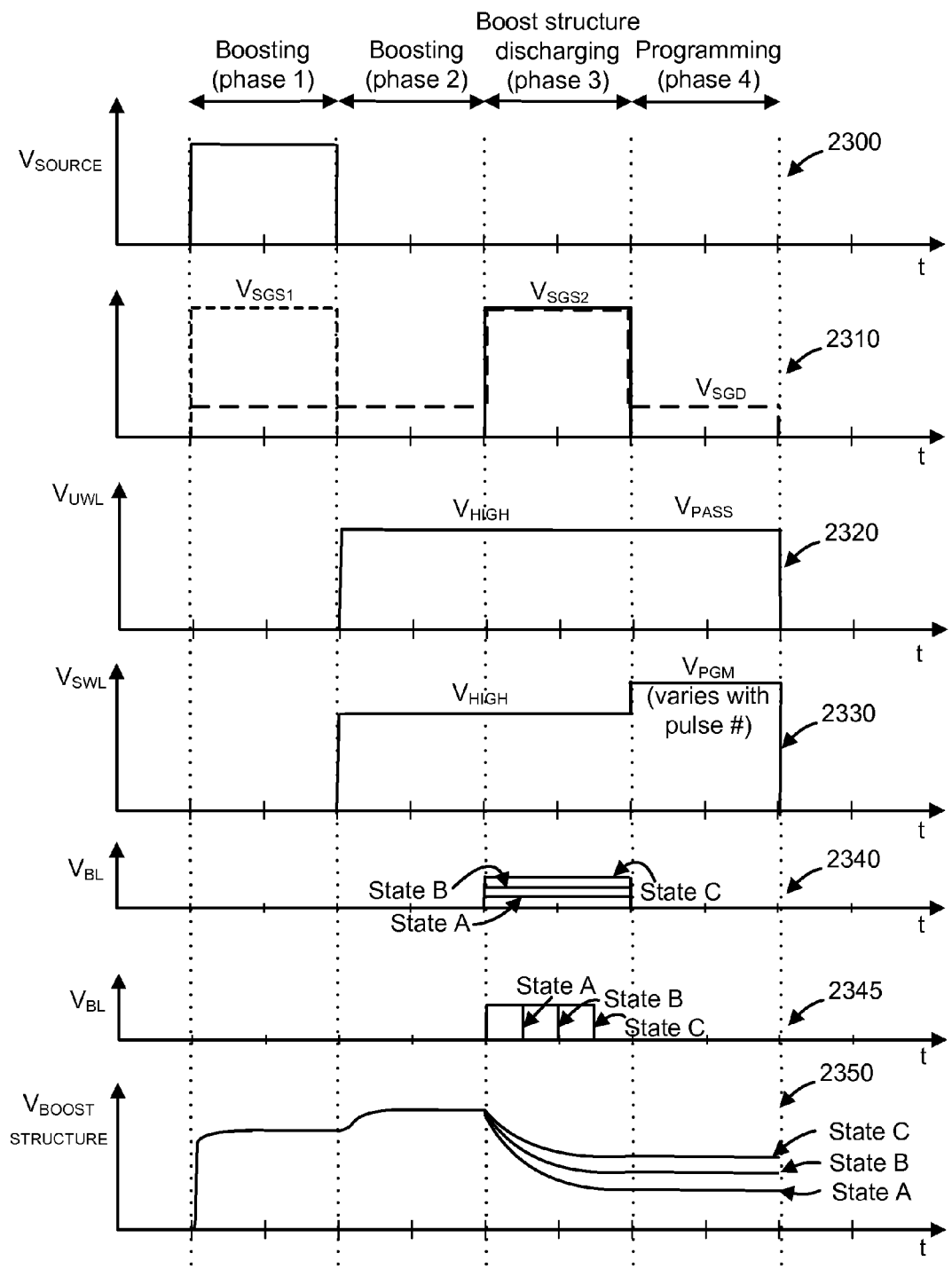
FIG. 23 depicts a timing diagram describing a process for programming non-volatile memory.

FIG. 23 depicts a timing diagram describing a process for programming non-volatile memory. One possible programming process includes four phases. For simplicity, in these and other figures, the duration of the phases are shown as being equal but, in practice, the duration of each phase can be optimized based on experimental results. Further, specific voltages to use can be optimized based on experimental results. The relative voltage levels indicated are not necessarily to scale and provide a high level guideline.

In one embodiment, as discussed, each NAND string can be provided with its own individually driven boost structure. The boost structures can be used during program, erase and/or read operations to provide couple a voltage to the storage elements. For example, the boost structures can couple a significant amount of voltage to the floating gates of the storage element to increase the total floating gate capacitance since the boost structures provide conductors to two additional facets of the storage elements (e.g., the sides). A higher floating gate capacitance results in better retention and more immunity to disturb phenomena, as the charge capacity increases and the Coulomb blockade effect is reduced. Furthermore, since a voltage on the boost structure is coupled to the storage elements, the voltages which are typically applied to the storage elements via word lines can be reduced by the amount of the coupled voltage. The voltages which are typically applied include the program voltage, $V_{PGM}$, and pass voltages, $V_{PASS}$. For example, the voltage coupled to the floating gate of a selected storage element can be expressed by the following equation:

$$V_{PGM} \times CR1 + V_{BOOST\ STRUCTURE} \times CR2 = V_{EFFECTIVE}, \quad (1)$$

where CR1 is a coupling ratio of the program voltage, $V_{PGM}$, to the floating gate of a storage element, CR2 is the coupling ratio of the boost structure voltage, $V_{BOOST\ STRUCTURE}$, to the floating gate, and $V_{EFFECTIVE}$ is the effective or net voltage at the floating gate. Thus, with $V_{EFFECTIVE}$ constant, $V_{PGM}$ can be reduced by $V_{BOOST\ STRUCTURE} \times CR2/CR1$. In one approach, $V_{BOOST\ STRUCTURE}$ can be obtained from eqn. (1). Thus, the boost structure can assist in programming the storage elements. Further, the amount of assistance provided can be set independently for each NAND string by applying a fixed boost voltage to one or more boost structures, then independently discharging the boost structures via the respective bit lines, as discussed in detail further below. The amount of discharge can be controlled by the bit line voltage.

An additional advantage of the boost structure is that a portion of the coupling to the floating gate of a storage element does not involve the inter-poly dielectric (e.g., see inter-poly dielectric layer 637, FIG. 7). This is true since portions of the boost structure which provide coupling can extend close to the substrate and adjacent to the floating gates (see, e.g., boost structure 1020 in FIG. 10), where the inter-poly dielectric is not between the boost structure and the floating gate. Thus, the burden on the inter-poly dielectric is reduced. Similarly, the thickness of the inter-poly dielectric can be reduced. The coupling of the boost structure can be significant since the coupling occurs from three facets of the floating gate (e.g., from the top and both sides).

Further, the increased capacitance will increase the number of electrons on the floating gate, thereby reducing the exacerbated retention and disturb issues which may result from charge quantization effects in floating gates with very small capacitances.

It is also possible to concurrently verify the programming state of multiple storage elements associated with a word line, for instance, since a potential of each boost structure can be set independently. In this case, the boost structures can augment the voltage applied to the control gates of the selected storage element via the word line by different amounts for the different verify levels of a multi-level storage element. For example, conventionally the verify process involves applying a verify voltage Vva, Vvb or Vvc to the control gate of a storage element via a word line and determining whether the storage element turns on. If it turns on, the storage element's $V_{TH}$ is less than the verify voltage. If it does not turn on, the storage element's only one verify voltage can be applied at a time on a word line. In contrast, with the boost structure provided herein, a fixed voltage, $V_{CG\text{-}VERIFY}$, can be provided on the word line and $V_{BOOST\ STRUCTURE}$ can be varied to provide the different verify voltages concurrently for different storage elements on a common word line. For example, the coupling from the boost structure to a control gate can be expressed by the following equation:

$$V_{CG\text{-}VERIFY} + V_{BOOST\ STRUCTURE} \times CR3 = V_{CG\text{-}EFFECTIVE}, \quad (2)$$

where CR3 is a coupling ratio of the boost structure voltage $V_{BOOST\ STRUCTURE}$ to the storage element's control gate, and $V_{CG\text{-}EFFECTIVE}$ is the effective or net voltage received at the control gate. The coupling ratio of $V_{CG\text{-}VERIFY}$ is one when the control gate is provided by a portion of the word line. $V_{BOOST\ STRUCTURE}$ can therefore be set for the NAND strings associated with different storage elements to achieve $V_{CG\text{-}EFFECTIVE}$=Vva, Vvb or Vvc. See also FIG. 25. In one approach, $V_{BOOST\ STRUCTURE}$ can be obtained from eqn. (2).

Generally, with bit line-by-bit line control of programming operations, and concurrent verification of multiple states, the number of program-verify operations can be reduced from a number that covers the width of the natural distribution of programming characteristics plus the programming window to a number that only covers the width of the natural distribution of programming characteristics. Further, the number of verify operations after each programming pulse can be reduced potentially down to one. This increase in programming operation speed facilitates the implementation of multi-level storage elements with an increased number of states, e.g., eight states or more per storage element. Also, as mentioned, a significant reduction in coupling effects due to the shielding function of the boost structure is also an enabling component of such a multi-level storage element.

Moreover, the read process can be augmented by the boost structures in a multi-cycle read process in which the programming state of one or more storage elements is determined in each cycle. The read process is analogous to the verify process except multiple cycles may be needed as the read state is not known in advance. By analogy to the verify process discussed above, the coupling from the boost structure to a control gate can be expressed by the following equation:

$$V_{CG\text{-}READ} + V_{BOOST\ STRUCTURE} \times CR3 = V_{CG\text{-}EFFECTIVE}, \quad (3)$$

where $V_{CG\text{-}READ}$ is the voltage on the word line in a given read cycle. $V_{BOOST\ STRUCTURE}$ can therefore be set accordingly for the different values of $V_{CG\text{-}READ}$. See also FIG. 25. In one approach, $V_{BOOST\ STRUCTURE}$ can be obtained from eqn. (3).

Further, the advantages provided by the boost structure in the programming, verifying and reading process can be achieved independently. That is, the boost structure can be fully discharged so that it has no effect during one or more of the programming, verifying and reading processes.

Specifically, FIG. 23 depicts four phases: a first boosting phase, a second boosting phase, a boost structure discharging phase and a programming phase. The cycle of four phases is repeated for each programming pulse. Waveform 2300 depicts a voltage, $V_{SOURCE}$, applied to the source side of a NAND string. This voltage is a boost voltage since it acts to boost a potential of the boost structure. As an example, $V_{SOURCE}$ can be about 8-10 V. Waveforms 2310 depict voltages which are applied to the select gates, including $V_{SGS1}$, $V_{SGS2}$ and $V_{SGD}$. Waveform 2320 depicts a voltage on the unselected word lines, $V_{UWL}$. Waveform 2330 depicts a voltage on the selected word line, $V_{SWL}$. Waveforms 2340 depict a voltage on the bit line of the selected NAND strings, $V_{BL}$, in a first approach. Waveforms 2345 depict a voltage on the bit line of the selected NAND strings in a second approach. Waveforms 2350 depict a resulting voltage of the boost structure, $V_{BOOST\ STRUCTURE}$, with the first or second approaches.

In the first boosting phase, the potential of the boost structure is increased. In one approach, the source supply line is common to a group of NAND strings, e.g., in a block, so the boost structure in each NAND string is boosted at the same time and to the same extent. To enable the source voltage, $V_{SOURCE}$, to reach the boost structure, the first select gate, e.g., the outer select gate, which is closest to the source supply line, is turned on, and the second select gate, e.g., the inner select gate, is kept off. Thus, the NAND string is configured to receive the boost voltage. In particular, $V_{SGS1}$ is set at a level which is sufficient to open the outer select gate. $V_{SGS1}$ can exceed $V_{SOURCE}$ by the threshold voltage of the outer select gate to turn the transistor on. The inner select gate can be maintained off by setting a lower value for $V_{SGS2}$, e.g., lower than $V_{SOURCE}$. $V_{UWL}$, $V_{SWL}$ and $V_{BL}$ can all be set to 0 V. Waveforms 2350 depict how $V_{BOOST\ STRUCTURE}$ is increased when $V_{SOURCE}$ is applied. The source supply line is electrically coupled to the boost structure via the outer select gate and its associated source/drain regions.

A second boosting phase can optionally be used to further boost the potential of the boost structure. In this phase, relatively high or elevated voltages, $V_{HIGH}$, applied to the word lines are coupled to the boost structure to further increase its potential. In one possible approach, $V_{HIGH}=V_{PASS}$, the pass voltage used during programming. This will boost the boost structure to an even higher voltage as it is floating in this phase. In particular, the outer select gate is turned off by dropping $V_{SGS1}$, ensuring that the boost structure does not discharge through the outer select gate, and $V_{UWL}$ and $V_{SWL}$ are increased to $V_{HIGH}$. Thus, both the outer and inner select gates are turned off. The increase in $V_{BOOST\ STRUCTURE}$ is depicted by waveforms 2350.

A third phase involves discharging of the boost structure. This provides the ability to independently control $V_{BOOST\ STRUCTURE}$ for each NAND string. In this phase, the outer select gate is turned off while the inner select gate and the drain-side select gate are turned on. For example, the inner select gate and the drain-side select gate can be turned on by setting $V_{SGS2}$ and $V_{SGD}$, respectively, to a relatively high level (waveform 2310). Further, $V_{UWL}$ and $V_{SWL}$ can be maintained at the previous level to maintain all storage elements open during the discharging. For example, this can be the highest read level which is used. The level to which the boost structure discharges can be controlled based on the applied bit line voltage, $V_{BL}$. In a first approach, as indicated by waveforms 2340, $V_{BL}$ can be set based on the programming state to which the selected storage element in the NAND string is to be programmed. For example, state C can be the highest programming state (having the highest $V_{TH}$), state B can be an intermediate programming state and state A can be the lowest programming state. For state C, $V_{BL}$ is set to a higher level to provide relatively little discharging of the boost structure, maintaining $V_{BOOST\ STRUCTURE}$ at a relatively high level. For state B, $V_{BL}$ is set to an intermediate level to provide an intermediate level of discharging, maintaining $V_{BOOST\ STRUCTURE}$ at an intermediate level. For state A, $V_{BL}$ is set to a low level to provide a high amount of discharging, maintaining $V_{BOOST\ STRUCTURE}$ at a low level. The specific values of $V_{BL}$ can be set based on the particular implementation, including the level of $V_{PGM}$ which is used. The spacing between the specific values of $V_{BL}$ may be non-linear.

In a second approach, as indicated by waveforms 2345, $V_{BL}$ can be set to a fixed amplitude pulse, where the duration of the pulse varies based on the programming state to which the selected storage element in the NAND string is to be programmed. Specifically, a longer pulse can be used for the higher programmed states, e.g., state C, while a shorter pulse is used for the lower programmed states, e.g., state A. Thus, the level to which the boost structure discharges can be set based on a level and/or duration of a voltage applied to a drain side of the NAND string.

Note also that $V_{BOOST\ STRUCTURE}$ can vary as $V_{PGM}$ varies with successive programming pulses. A higher $V_{BOOST\ STRUCTURE}$ can compensate for a lower $V_{PGM}$ and a lower $V_{BOOST\ STRUCTURE}$ can compensate for a higher $V_{PGM}$. The decrease in $V_{BOOST\ STRUCTURE}$ in each case is depicted by waveforms 2350. In the example provided, the boost structure is discharged for all programmed states to a level in which some charge remains. In one option, for the highest programmed state, e.g., state C, the boost structure need not be discharged at all. In another option, for the lowest programmed state, e.g., state A, the boost structure can be fully discharged.

Figure 26:
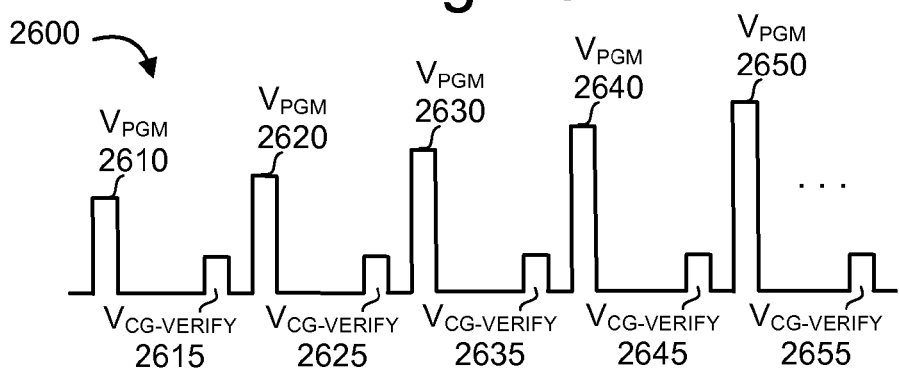
FIG. 26 depicts an example waveform applied to the control gates of non-volatile storage elements during programming.

The fourth phase is a programming phase in which $V_{PGM}$ is applied to the selected word line (waveform 2330). $V_{PGM}$ can increase in a staircase manner with each successive programming pulse (FIG. 26). With the boost structures charged to various data-dependent voltages, the bit lines can now deliver the program or the inhibit voltages to the NAND strings. Here, the inner and outer select gates are both turned off. A pass voltage $V_{PASS}$ can be applied to the unselected word lines (waveform 2320), depending on the particular technique used. In some programming techniques, the source-side and/or drain-side neighboring unselected word lines receive different voltages, such as 0 V or other low voltage, than the other unselected word lines, which receive $V_{PASS}$. As mentioned, the voltage on the boost structure is coupled to the floating gates of the storage elements to drive electrons into the floating gate and increase the threshold voltage. The boost structure augments the voltage coupled by the selected word line so the effect is the same as if a larger $V_{PGM}$ were used on the selected word line and as if a larger $V_{PASS}$ were used on the unselected bit lines. However, the disadvantages of using a larger $V_{PGM}$ or $V_{PASS}$, such as program disturb, are avoided. Alternatively, or additionally, the boost structure can reduce programming time. Note that optimal values for the voltages shown can be determined by experimentation and will vary for different memory devices.

After the program pulse is finished in the fourth phase, the word lines are brought down and a verification process is performed. The boost structure is floating and is coupled down by this action.

Figure 24:
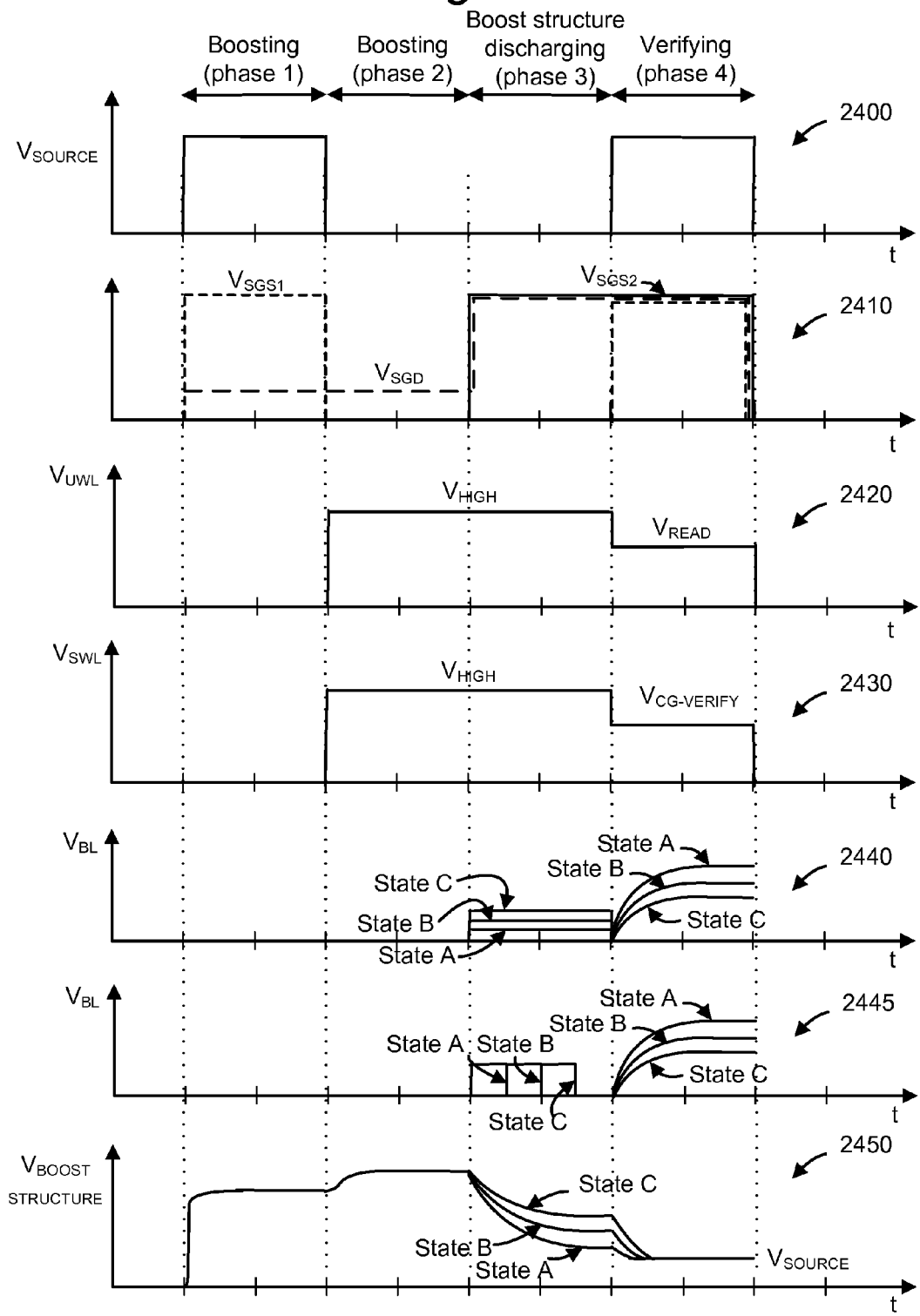
FIG. 24 depicts a timing diagram describing a process for verifying a programming state of non-volatile memory.

FIG. 24 depicts a timing diagram describing a process for verifying a programming state of non-volatile memory.

Waveform 2400 depicts $V_{SOURCE}$, waveforms 2410 depict $V_{SGS1}$, $V_{SGS2}$ and $V_{SGD}$, waveform 2420 depicts $V_{UWL}$, waveform 2430 depicts $V_{SWL}$, waveforms 2440 and 2445 depict $V_{BL}$ in two different approaches, and waveform 2450 depicts $V_{BOOST\ STRUCTURE}$. In one embodiment, phases 1 and 2 are the same as for the programming process of FIG. 23. Phase 3 can also be analogous to the programming process of FIG. 23, except that $V_{BL}$ can vary somewhat so that the boost structure is discharged according to the verify level of the selected storage elements.

In the fourth phase, the source-side select gates are turned on by raising $V_{SGS1}$ and $V_{SGS2}$, as depicted by waveforms 2410 and $V_{SOURCE}$ is raised to the highest positive voltage required for verifying the highest programming state for the group of storage elements to be concurrently verified. $V_{SGD}$ is also set so that the drain-side select gate is turned on. The waveforms 2410 are offset for clarity. The word line voltage, $V_{CG-VERIFY}$, is applied to each storage element to be verified via an associated word line. The effect of the boost structure is as if a different $V_{CG-VERIFY}$ was applied to each selected storage element according to the particular verify level of the storage element. As a result, the storage elements can be concurrently verified using different verify levels, resulting in significant time savings. Thus, a single pass through the four phases can be sufficient to characterize the programming state of all storage elements on a word line relative to a verify level. The number of states in the group of states which can be concurrently verified depends, e.g., on the $V_{TH}$ separation of neighbor states, on the boost structure-to-floating gate capacitive coupling, and on the maximum range of allowed voltages on the assist gates. In some cases, an additional verify pass may be used. If the threshold voltage of the storage element selected for verifying is less than the verify level, the selected storage element will turn on. In this case, the storage element has not reached the target programming state, e.g., verify level, and requires one or more additional programming pulses. If the threshold voltage of the storage element selected for verifying is greater than the verify level, the selected storage element will not turn on, indicating that the storage element has reached the target programming state and can be locked out from further programming.

Further, $V_{BOOST\ STRUCTURE}$ discharges as indicated by waveforms 2450, and $V_{BL}$ rises as indicated by waveforms 2445. The level to which $V_{BL}$ rises is indicative of a programming condition of the storage element being verified. In particular, a verify process can be used as discussed in connection with FIG. 25.

Figure 25:
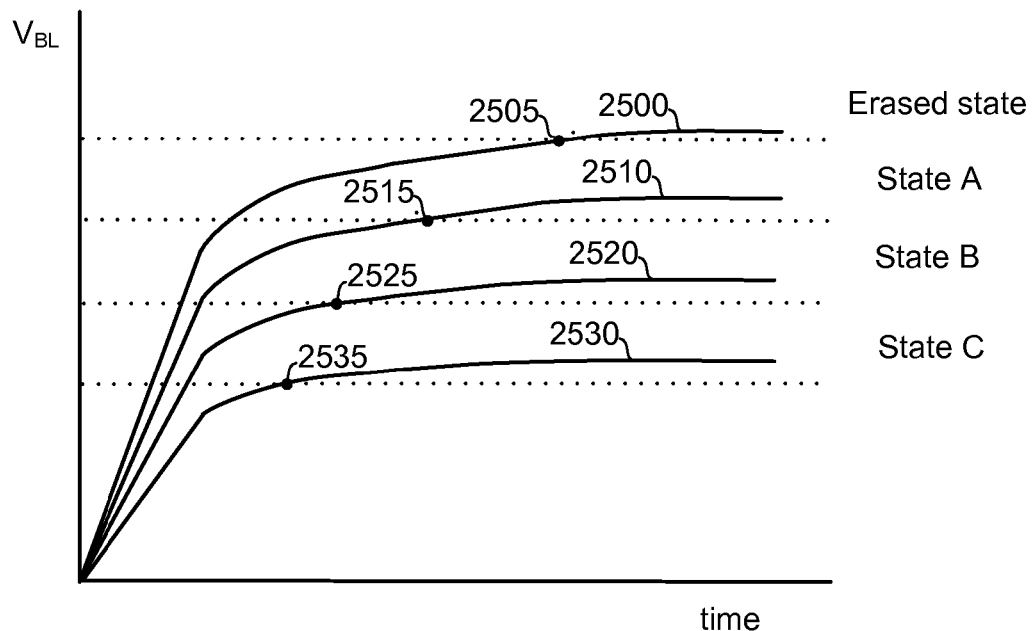
FIG. 25 is a graph depicting a bit line voltage versus time relationship for different programming states.

FIG. 25 is a graph depicting a bit line voltage versus time relationship for different programming states. As mentioned, the boost voltage of the boost structure can be set based on a target verify level or a read level. During the verify phase, the bit lines are initially discharged, at least partly, and begin charging up during an integration time to different levels until a body bias causes the storage elements to stop charging. The charging up of $V_{BL}$ to a plateau is depicted in FIG. 25. The bit lines to be verified against different target states can be sensed concurrently, reducing the number of verify operations down to one or two. In particular, curves 2500, 2510, 2520 and 2530 denote $V_{BL}$ when the storage element is in state C, state B, state A and the erased state, respectively. When curve 2500 exceeds a trip point 2505, the associated storage element shuts off. Similarly, when curve 2510 exceeds a trip point 2515, the associated storage element shuts off, when curve 2520 exceeds a trip point 2525, the associated storage element shuts off and when curve 2530 exceeds a trip point 2535, the associated storage element shuts off. A determination that a storage element has reached a target verify level can therefore be made during the verify phase. Similarly, a determination that a storage element has reached a specific read level can be made during the read phase. Thus, a programming condition of a storage element can be determined by monitoring $V_{BL}$ during a verify or read process.

FIG. 26 depicts an example waveform applied to the control gates of non-volatile storage elements during programming. A voltage waveform 2600 includes a series of program pulses 2610, 2620, 2630, 2640, 2650, . . . , that are applied to a word line selected for programming. In one embodiment, the programming pulses have a voltage, $V_{PGM}$, which starts at an initial level and increases by increments, e.g., 0.5 V, for each successive programming pulse until a maximum level is reached. As mentioned, the level of $V_{PGM}$ can advantageously be reduced with the use of a boost structure as discussed herein. In between the program pulses are verify pulses 2615, 2625, 2635, 2645, 2655, . . . . Further, in some embodiments, only one verify pulse need be used. In other embodiments, there can be additional verify pulses. The verify pulses can have an amplitude of $V_{CG-VERIFY}$ as discussed previously (see FIG. 24).

Figure 27:
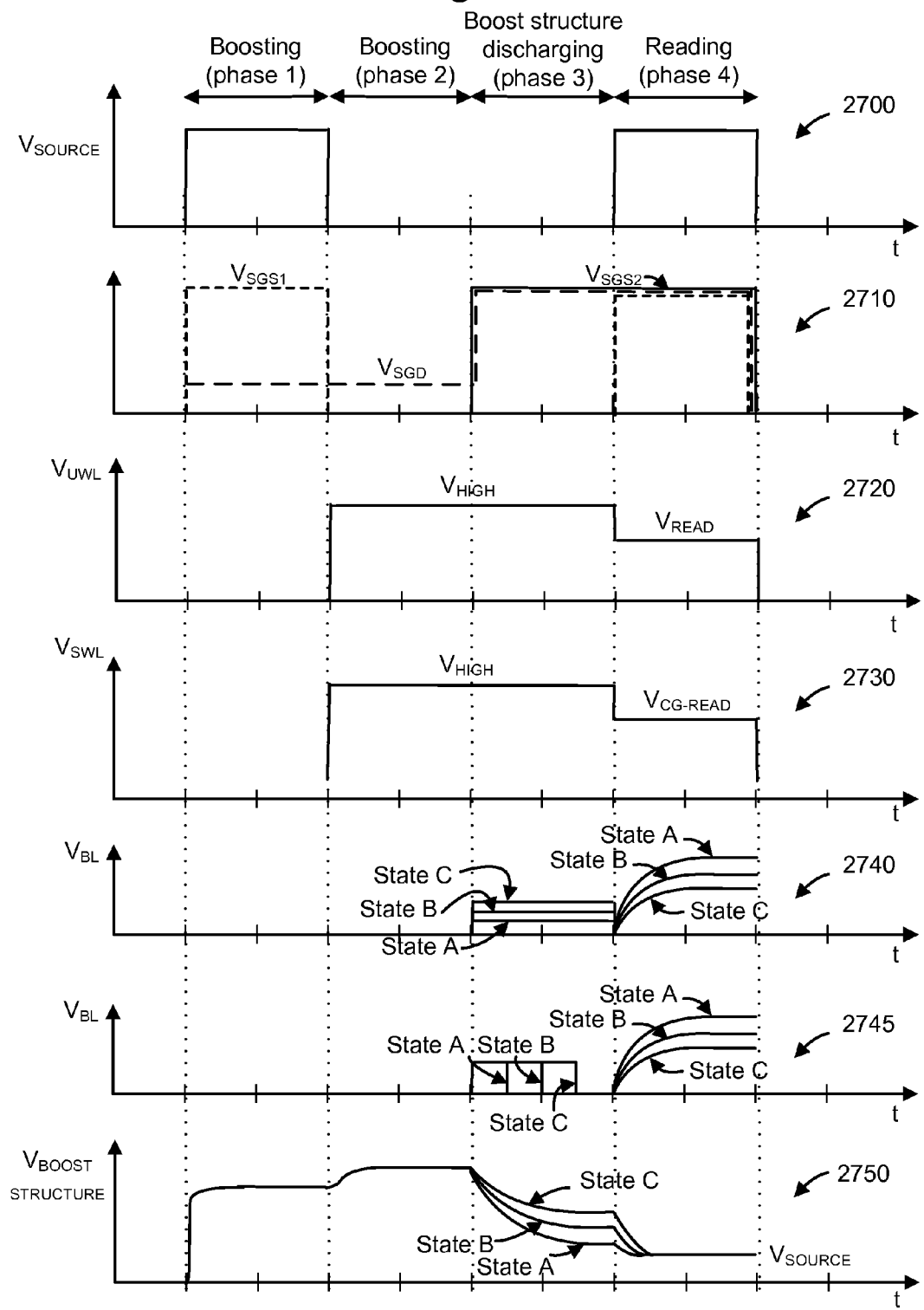
FIG. 27 depicts a timing diagram describing a process for reading a programming state of non-volatile memory.

FIG. 27 depicts a timing diagram describing a process for reading a programming state of non-volatile memory. Waveform 2700 depicts $V_{SOURCE}$, waveforms 2710 depict $V_{SGS1}$, $V_{SGS2}$ and $V_{SGD}$, waveform 2720 depicts $V_{UWL}$, waveform 2730 depicts $V_{SWL}$, waveforms 2740 and 2745 depict $V_{BL}$, in two different approaches, and waveform 2750 depicts $V_{BOOST\ STRUCTURE}$. The first two phases and the fourth phase are analogous to the verify process of FIG. 24. Phase 3 can also be analogous to the verify process of FIG. 24, except that the level and/or duration $V_{BL}$ can vary somewhat so that the boost structure is discharged according to the read level, which can vary from the verify level (see, e.g., FIG. 20). In the fourth phase, the source-side select gates are turned on by raising $V_{SGS1}$ and $V_{SGS2}$, as depicted by waveforms 2710 and $V_{SOURCE}$ is raised to the highest positive voltage required for reading the highest programming state for the group of storage elements to be concurrently read. $V_{SGD}$ is also set so that the drain-side select gate is turned on. The waveforms 2710 are offset for clarity.

The read process is analogous to the verify process except that a cycle through the phases is performed for each read level since the programming state may be tested against multiple read levels rather than a single verify level. In particular, the first through third phases can be the same as discussed above in connection with the programming and verify processes, except that all of the NAND strings are discharged to the same level, in one embodiment, based on the read level (e.g., Vra, Vrb or Vrc) for state A, B or C, for instance (waveform 2740) of the current read cycle. Further, the fourth phase can be the same as discussed in connection with the fourth phase of the verify process of FIG. 24, except that the selected word line voltage is $V_{CG-READ}$, which varies for each read cycle. For example, $V_{CG-READ}$ can have a value which is based on the read level. In one approach, $V_{CG-READ}$=Vra, Vrb or Vrc (FIG. 20) less the control gate coupling provided by the boost structure.

Figure 28:
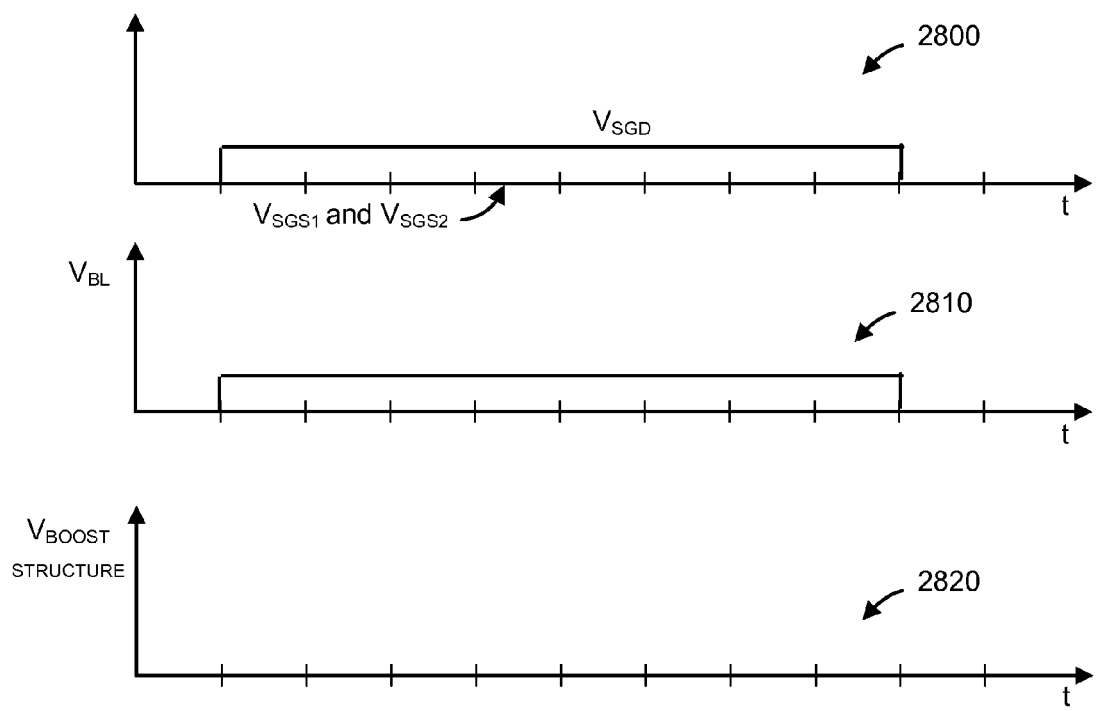
FIG. 28 depicts a timing diagram for unselected bit lines during programming, verifying or reading of non-volatile memory.

FIG. 28 depicts a timing diagram for unselected bit lines during programming, verifying or reading of non-volatile memory. As indicated by waveform 2800, $V_{SGS1}$ and $V_{SGS2}$ can be maintained at 0 V to keep the source-side select gates turned off. $V_{SGD}$ (waveform 2800) and $V_{BL}$ (waveform 2810) can be maintained at a relatively low, comparable levels to keep the drain-side select gate turned off. As a result, the boost voltage $V_{SOURCE}$ is not coupled to the boost structure, so $V_{BOOST\ STRUCTURE}$ remains at 0 V.

Figure 29:
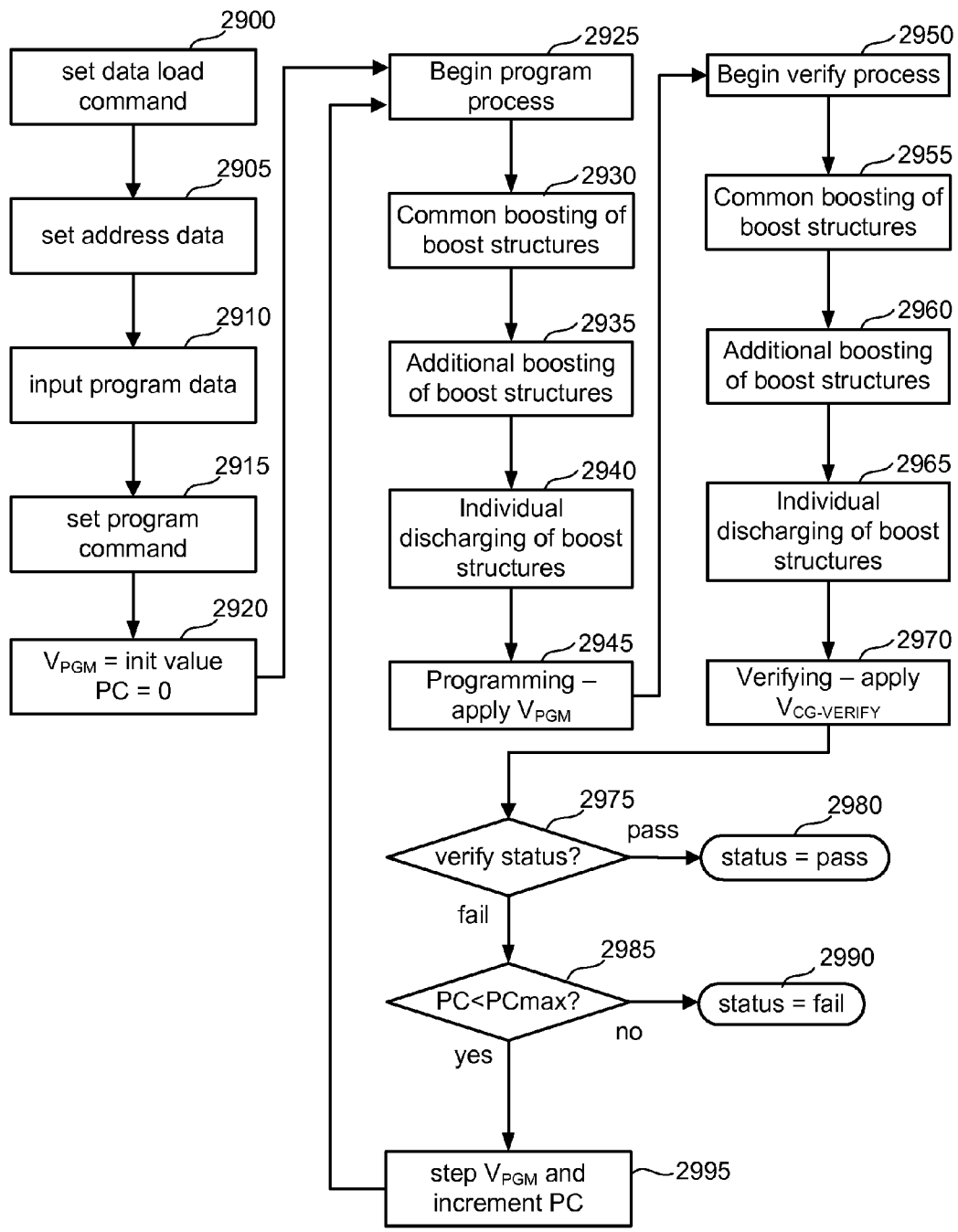
FIG. 29 is a flow chart describing one embodiment of a process for programming non-volatile memory.

FIG. 29 is a flow chart describing one embodiment of a process for programming non-volatile memory. In one implementation, storage elements are erased (in blocks or other units) prior to programming. In step 2900, a "data load" command is issued by the controller and input received by control circuitry 1610 (FIG. 16). In step 2905, address data designating the page address is input to decoder 1614 from the controller or host. In step 2910, a page of program data for the addressed page is input to a data buffer for programming. That data is latched in the appropriate set of latches. In step 2915, a "program" command is issued by the controller to state machine 1612.

Triggered by the "program" command, the data latched in step 2910 will be programmed into the selected storage elements controlled by state machine 1612 using the stepped pulses 2610, 2620, 2630, 2640, 2650, . . . of FIG. 26 applied to the appropriate word line. In step 2920, the program voltage, $V_{PGM}$, is initialized to the starting pulse and a program counter PC maintained by state machine 1612 is initialized at zero. In step 2925, a programming process begins (see also FIG. 23). Specifically, at step 2930, a common boosting of the boost structures is performed. At step 2935, additional boosting of the boost structures can be performed. At step 2940, individual discharging of boost structures occurs based on the target programming state of the associated selected storage elements. At step 2945, programming of the selected storage elements occurs by applying $V_{PGM}$ on the selected word line. If logic "0" is stored in a particular data latch indicating that the corresponding storage element should be programmed, then the corresponding bit line is grounded. On the other hand, if logic "1" is stored in the particular latch indicating that the corresponding storage element should remain in its current data state, then the corresponding bit line is connected to $V_{DD}$ to inhibit programming.

At step 2950, a verify process begins. Specifically, at step 2955, a common boosting of the boost structures is performed. At step 2960, additional boosting of the boost structures can be performed. At step 2965, individual discharging of boost structures occurs based on the target verify level which can differ among the storage elements. At step 2970, verifying of the selected storage elements occurs by applying $V_{CG-VERIFY}$ on the selected word line and characterizing a programming state of the selected storage elements such as by determining whether the selected storage elements turn on (see also FIGS. 24 and 25). If it is detected that the target threshold voltage of a selected storage element has reached the appropriate verify level, then the data stored in the corresponding data latch is changed to a logic "1." If it is detected that the threshold voltage has not reached the appropriate verify level, the data stored in the corresponding data latch is not changed. In this manner, a bit line having a logic "1" stored in its corresponding data latch does not need to be programmed further. When all of the data latches are storing logic "1," the state machine (via the wired-OR type mechanism described above) knows that all selected storage elements have been programmed.

In step 2975, a determination is made as to whether all of the data latches are storing logic "1." If so, the programming process is complete and successful because all selected storage elements were programmed and verified, and a status of "PASS" is reported in step 2980. If, in step 2975, it is determined that not all of the data latches are storing logic "1," then the programming process continues. In step 2985, the program counter PC is checked against a program limit value PCmax. One example of a program limit value is twenty; however, other numbers can also be used. If the program counter PC is not less than PCmax, then the program process has failed and a status of "FAIL" is reported in step 2990. If the program counter PC is less than PCmax, then $V_{PGM}$ is increased by the step size and the program counter PC is incremented in step 2995. After step 2995, the process loops back to step 2925 to apply the next programming pulse.

Figure 30:
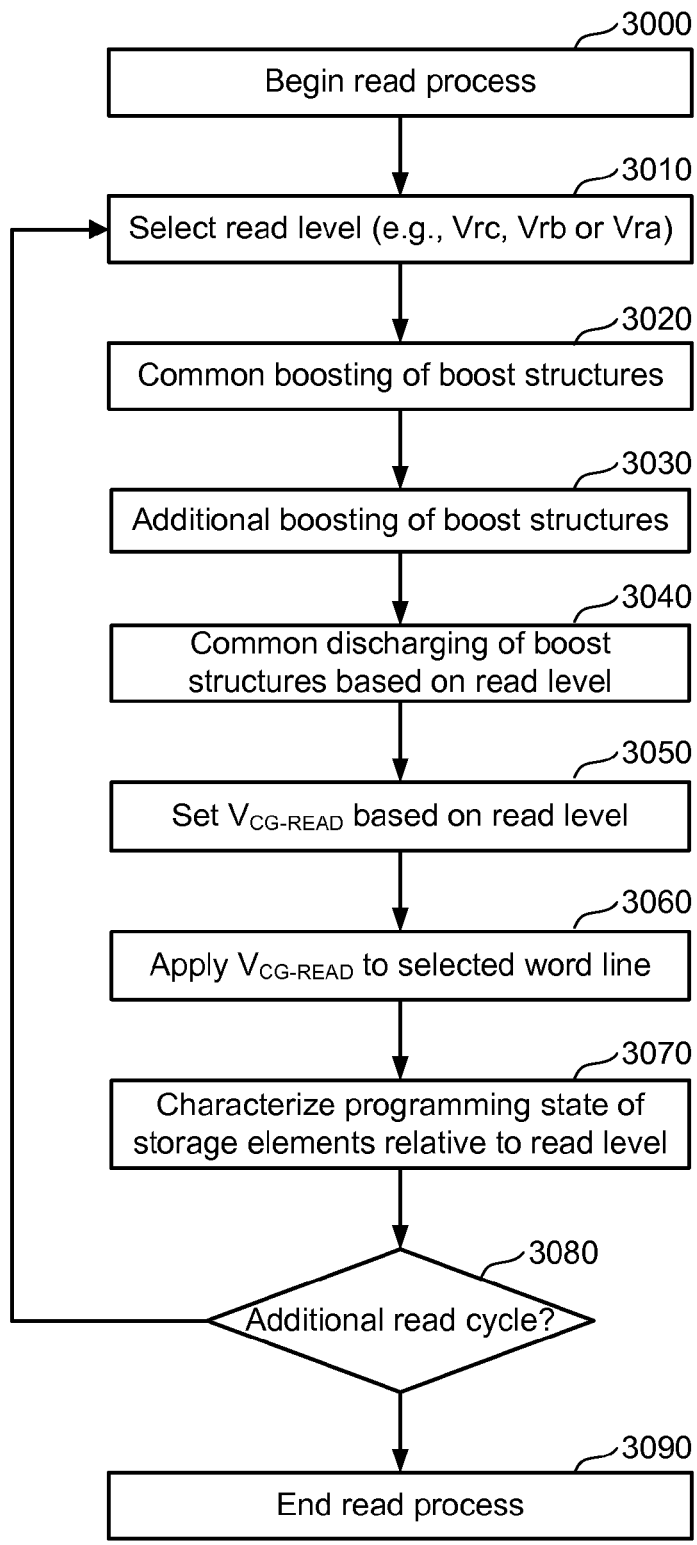
FIG. 30 is a flow chart describing one embodiment of a process for reading a non-volatile memory.

FIG. 30 is a flow chart describing one embodiment of a process for reading a non-volatile memory. The read process begins at step 3000 and can include a number of read cycles, one for each read state. In a first read cycle, step 3010 includes selecting a read level, e.g., Vrc, Vrb or Vra (see FIG. 20). Additional read cycles can be performed when the storage elements include additional states, e.g., eight states instead of four. In one approach, the process begins with the highest read state, e.g., state C which has a read verify level of Vrc. Step 3020 includes performing common boosting of the boost structures while step 3030 includes performing additional boosting of the boost structures. Step 3040 includes discharging the boost structures to a common level based on the current read level. Step 3050 includes setting a control gate voltage $V_{CG-READ}$ based on the current read level, and step 3060 includes applying $V_{CG-READ}$ to the selected word line. Step 3070 includes characterizing the programming states of the storage elements relative to the current read level, e.g., by determining whether the storage elements turn on when $V_{CG-READ}$ is applied. For instance, if a storage element does not turn on, it can be concluded that it is in state C. At decision block 3080, a determination is made as to whether there are additional read cycles remaining. If an additional cycle is remaining, the process continues at step 3010 by selecting the next read level. The process continues until there are no additional read cycles, at which point the read process ends (step 3090).

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method for fabricating non-volatile storage, comprising:
   forming a set of storage elements, at least in part, on a substrate;
   forming inner and outer select gates at a first end of the set of storage elements the set of storage elements and the inner and outer select gates are provided in a NAND string, and the inner and outer select gates are provided at a source side of the NAND string;
   forming a source line on the substrate, the outer select gate is adjacent to, and between, the source line and the inner select gate; and
   forming a boost structure extending along the set of storage elements and in communication with the substrate at a location between the inner and outer select gates, the boost structure is conductive.

2. The method of claim 1, wherein:
   the location at which the boost structure communicates with the substrate comprises a source/drain region between the inner and outer select gates.

3. The method of claim 1, wherein:
the boost structure comprises an elongated conductive material.

4. The method of claim 1, wherein:
the boost structure comprises a portion that extends vertically toward the substrate adjacent to a floating gate of at least one of the storage elements for shielding the floating gate from an adjacent floating gate of an adjacent storage element.

5. The method of claim 1, wherein:
the control line is formed on a first source/drain region in the substrate, adjacent to the outer select gate, and the boost structure does not communicate with the substrate at the first source/drain region.

6. A method for fabricating non-volatile storage, comprising:
forming a plurality of NAND strings on a substrate;
forming inner and outer select gates at a first end of each NAND string, the inner and outer select gates are provided at a source side of each NAND string;
forming a plurality of boost structures, each boost structure extends along a respective NAND string and communicates with the substrate at respective source/drain regions between the inner and outer select gates of the respective NAND string, the boost structures are conductive; and
forming control lines for concurrently applying a common boost voltage to each boost structure via the respective NAND strings.

7. The method of claim 6, wherein:
each boost structure is independently controllable during programming operations via voltages applied to the respective NAND strings.

8. The method of claim 6, wherein:
the control lines control the inner and outer select gates of each NAND string and supply the common boost voltage to each boost structure via the first end of each NAND string.

9. The method of claim 6, further comprising:
forming control lines for independently discharging each boost structure, at least in part.

10. The method of claim 9, further comprising:
forming a select gate at a second end of each NAND string, the control lines control the select gate at the second end of each NAND string to perform the independent discharging.

11. The method of claim 9, wherein:
the control lines include bit lines which supply voltages to a second end of each NAND string for controlling a level to which each boost structure is independently discharged.

* * * * *